US012587094B2

(12) United States Patent
Rehani et al.

(10) Patent No.: US 12,587,094 B2
(45) Date of Patent: Mar. 24, 2026

(54) AREA EFFICIENT LV NMOS TWL CHARGE PUMP

(71) Applicant: Sandisk Technologies, Inc., Milpitas, CA (US)

(72) Inventors: Ankit Rehani, Burari (IN); V.S.N.K. Chaitanya G, Bengaluru (IN); Pradeep Anantula, Bangalore (IN)

(73) Assignee: Sandisk Technologies, Inc., Milpitas, CA (US)

( * ) Notice: Subject to any disclaimer, the term of this patent is extended or adjusted under 35 U.S.C. 154(b) by 329 days.

(21) Appl. No.: 18/353,468

(22) Filed: Jul. 17, 2023

(65) Prior Publication Data

US 2024/0213877 A1 Jun. 27, 2024

Related U.S. Application Data

(60) Provisional application No. 63/435,491, filed on Dec. 27, 2022.

(51) Int. Cl.
H02M 3/07 (2006.01)
H02M 1/088 (2006.01)
*G11C 16/30* (2006.01)

(52) U.S. Cl.
CPC .............. H02M 3/07 (2013.01); H02M 1/088 (2013.01); *G11C 16/30* (2013.01)

(58) Field of Classification Search
CPC ............................................... H02M 3/07–075
See application file for complete search history.

(56) References Cited

U.S. PATENT DOCUMENTS

| | | | |
|---|---|---|---|
| 5,422,586 A | 6/1995 | Tedrow | |
| 6,078,212 A | 6/2000 | Lakhani | |
| 7,453,711 B2 * | 11/2008 | Yanagida | H02M 3/07 363/59 |
| 8,699,247 B2 | 4/2014 | Nguyen | |
| 8,963,624 B2 | 2/2015 | Murakami | |
| 11,381,164 B1 | 7/2022 | Rehani | |
| 11,569,738 B1 * | 1/2023 | Chinthu | H02M 3/07 |
| 2008/0174360 A1 * | 7/2008 | Hsu | H02M 3/073 327/536 |
| 2009/0027108 A1 * | 1/2009 | Chen | H02M 3/073 327/536 |
| 2009/0302930 A1 | 12/2009 | Pan | |

* cited by examiner

*Primary Examiner* — Sisay G Tiku

(74) *Attorney, Agent, or Firm* — Pearl Cohen Zedek Latzer Baratz LLP

(57) ABSTRACT

The application generally discloses systems and methods of generating a voltage waveform having an amplitude three times an input voltage amplitude using a plurality of low voltage (LV) triple well (TWL) N-type field effect devices. The method includes: receiving a first input voltage at a first input of a double switch charge transfer switch (CTS) circuit; applying a 2× kick voltage to a first capacitor coupled to a first portion of the double switch CTS circuit, the first capacitor configured to discharge a kick voltage to a source of a first LV TWL N-type field effect device; and applying a 1× kick voltage to a second capacitor coupled a second portion of the double switch CTS circuit, the second capacitor configured to discharge a kick voltage to a source of a second LV TWL N-type field effect device.

20 Claims, 22 Drawing Sheets

AREA EFFICIENT LV NMOS TWL CHARGE PUMP

CROSS REFERENCE TO RELATED APPLICATIONS

This application claims the benefit of and priority to U.S. Provisional Patent Application No. 63/435,491, filed on Dec. 27, 2022, the contents of which are incorporated herein by reference in their entirety.

BACKGROUND

Voltage multipliers increase an input supply voltage in order to provide a higher output voltage required to operate circuit elements in integrated circuits. A charge pump is one type of voltage multiplier typically employed in non-volatile memory systems, such as flash memory systems, to provide voltages required for programming and erasing memory cells in a non-volatile memory.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

Figure 1:
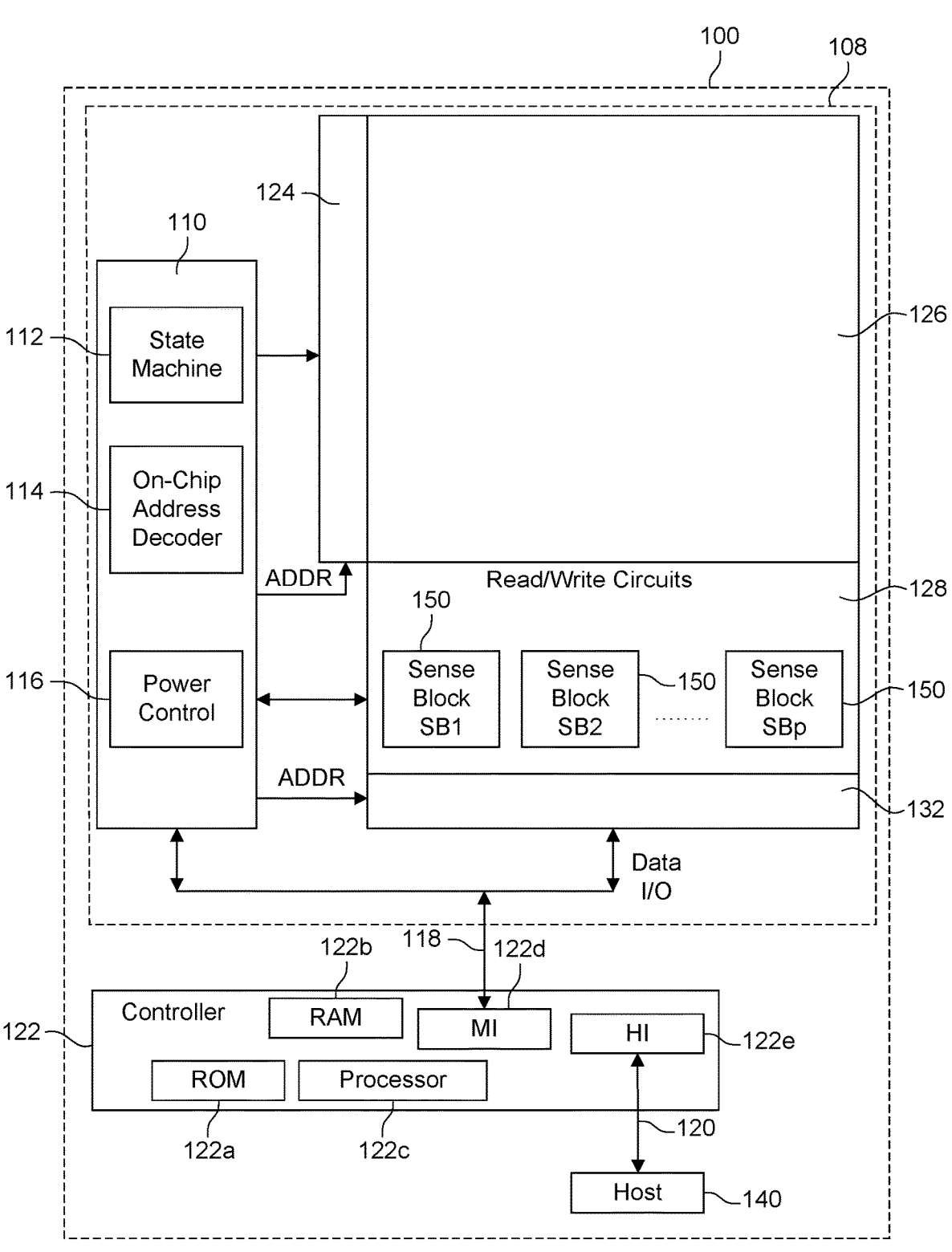
FIG. 1 is a block diagram of an example memory device, in connection with which, example embodiments of the disclosed technology can be implemented.

The figures are not exhaustive and do not limit the present disclosure to the precise form disclosed.

DETAILED DESCRIPTION

Charge pumps are used in many contexts. For example, charge pumps are used as peripheral circuits on flash EEPROM and other non-volatile memories to generate many of the needed operating voltages, such as programming or erase voltages, from a lower power supply voltage. Given the common reliance upon charge pumps, there is a need for improvements in pump design, particularly with respect to trying to reduce the circuit footprint and the current power consumption requirements of charge pumps. For example, in many non-volatile memory applications, several different regulated outputs are needed concurrently. These concurrent outputs require a large circuit footprint and consume large amounts of power. The efficiency of these systems can be improved by reducing both their power and energy requirements, while retaining the accuracy of the output levels.

Charge pumps use a switching process to provide a DC output voltage larger than its DC input voltage. Typical charge pumps include a plurality of capacitors disposed between portions of the charge pump circuit. The plurality of capacitors are charged with a kick voltage and discharged to amplify an input voltage. Each portion of the charge pump circuit is referred to as a "stage." Charge pumps typically include several stages configured to increase the amplitude of a voltage waveform applied to each stage as an input. Each stage is charged and discharged during a clock cycle of the charge pump. By progressively storing an increased amount of charge on the capacitor component of each stage the charge pump produces an increasing voltage level.

A number of charge pump designs, such as conventional Dickson-type pumps, are known in the art. Conventional charge pumps include a capacitor coupled to switches between an input and an output. During a first half of a clock cycle (e.g., a charging half), the capacitor is coupled in parallel to the input to charge up the input voltage. During a second half of a clock cycle (e.g., a transfer half), the charged capacitor is coupled in series with the input voltage to provide an output voltage twice the level of the input voltage.

A conventional charge pump suffers from a few flaws. Conventional charge pumps use a combination of high voltage (HV) capacitors and low voltage (LV) capacitors.

LV capacitors have a higher capacitor density and therefore require a smaller circuit footprint. HV capacitors have a lower capacitor density and therefore require a larger circuit footprint. The larger the circuit footprint, the less efficient the circuit. Thus, increasing the amount of LV capacitors and decreasing the amount of HV capacitors in a charge pump circuit increases the performance of the charge pump.

Conventional charge pump circuits include a LV capacitor to HV capacitor ratio of 1:1 (LV:HV). For example, a conventional charge pump configured to amplify the input voltage by 7× requires 3 LV capacitors and 3 HV capacitors. The 3 HV capacitors increase the circuit footprint, as HV capacitors are less dense than LV capacitors. By altering the kick voltage of HV capacitors from 1× to 2×, the proposed charge pump improves the LV capacitor to HV capacitor ratio from 1:1 (LV:HV) to 3:1 (LV:HV). The 2× kick voltage can be generated by a LV stage, and passed to downline stages. However, passing a 2× kick voltage through an N-type field effect transistor device based charge transfer switch (CTS) in a conventional charge pump would violate an electrical design rule (EDR) for N-type field effect transistor devices degrading performance of the CTS switch and the conventional charge pump in which they are disposed. To avoid an EDR violation, some conventional CTS switch designs use HV transistors.

Unlike LV transistors, HV transistors are more capable of transmitting 2× kick voltages. However, HV transistors require a larger circuit footprint. The proposed circuit architecture of the area efficient charge pump applies a novel double switch CTS design that uses low voltage triple well N-type field effect transistors (LV TWL NMOS) instead of HV transistors used in conventional CTS designs. By using LV TWL NMOS transistors (hereafter referred to as LV TWL NMOS devices) in place of HV transistors, the proposed double switch CTS design avoids an EDR violation.

Use of conventional CTS designs with HV transistors avoids an EDR violation. However, although transmitting a 2× kick voltage using conventional CTS designs do not result in EDR violations, transmitting 2× kick voltage using conventional CTS design and HV transistors results in a larger circuit footprint. Conventional CTS designs use LV N-type devices with 1× kick voltage. Use of the conventional CTS design with an LV N-type devices with 2× kick voltage results in an EDR violation. The proposed double switch CTS design uses LV N-type devices with 2× kick voltage without an EDR violation. Thus, the proposed double switch CTS design avoids the need to use HV N-type transistors. In addition, the use of a 3:1 LV capacitor to HV capacitor ratio for the charge pump and the use of LV TWL NMOS devices in the proposed CTS design leads to a 17% area reduction in the charge pump circuit footprint.

FIG. 1 is a block diagram of an example non-volatile memory system 100. In one embodiment, the non-volatile memory system 100 is a card-based system, such as a secure digital (SD) or a micro secure digital (micro-SD) card. In an alternate embodiment, memory system 100 is part of an embedded memory system. For example, the flash memory may be embedded within the host. In other examples, memory system 100 can be a solid state drive (SSD). The non-volatile memory system 100 includes one or more non-volatile memory dies 108, and a controller 122. The memory die 108 can be a complete memory die or a partial memory die. As seen here, the memory die 108 includes a memory structure 126, control circuitry 110, and read/write/erase circuits 128. The memory structure 126 is addressable by wordlines via a row decoder 124 and by bitlines via a column decoder 132. The read/write/erase circuits 128 include multiple sense blocks 150 including SB1, SB2, . . . , SBp (hereinafter referred to as sensing circuitry). The read/write/erase circuits 128 and sensing circuitry allow a page of memory cells to be read, programmed, or erased in parallel.

In one embodiment, memory structure 126 comprises a three-dimensional (3D) memory array of non-volatile memory cells in which multiple memory levels are formed above a single substrate, such as a wafer. The memory structure may comprise any type of non-volatile memory monolithically formed in one or more physical levels of arrays of memory cells having an active area disposed above a silicon (or other type of) substrate. In one example, the non-volatile memory cells comprise vertical NAND strings with charge-trapping material. In another embodiment, memory structure 126 comprises a two-dimensional (2D) memory array of non-volatile memory cells. In one example, the non-volatile memory cells are NAND flash memory cells utilizing floating gates.

The exact type of memory array architecture or memory cell included in memory structure 126 is not limited to the examples above. Many different types of memory array architectures or memory technologies can be used to form memory structure 126. No particular non-volatile memory technology is required for purposes of the new claimed embodiments proposed herein. Other examples of suitable technologies for memory cells of the memory structure 126 include 2D arrays, 3D arrays, and other memory structures that may have a string configuration. Although current iterations of other memory structure (e.g., MRAM, PCM, and Spin RAM) are configured without a string, memories of these cells can be configured into a topology that has a string, and thus could be utilized in a format that would allow them to be erased in a block format and programmed in chunks. Thus, in this potential configuration, embodiments of the disclosure could be foreseeably applied.

A person of ordinary skill in the art will recognize that the technology described herein is not limited to a single specific memory structure, but covers many relevant memory structures within the spirit and scope of the technology as described herein and as understood by one of ordinary skill in the art.

The control circuitry 110 cooperates with the read/write/erase circuits 128 to perform memory operations (e.g., write, read, erase) on memory structure 126, and includes state machine 112, an on-chip address decoder 114, and a power control circuit 116. In one embodiment, control circuitry 110 includes buffers such as registers, read-only memory (ROM) fuses and other storage devices for storing default values such as base voltages and other parameters. The on-chip address decoder 114 provides an address interface between addresses used by host 140 or controller 122 and the hardware address used by the decoders 124 and 132. Power control circuit 116 controls the power and voltages supplied to the wordlines, bitlines, and select lines during memory operations. The power control circuit 116 includes voltage circuitry, in one embodiment. Power control circuit 116 may include charge pumps for creating voltages. The sense blocks 150 include bitline drivers. The power control circuit 116 executes under control of the state machine 112, in one embodiment.

State machine 112 and/or controller 122 (or equivalently functioned circuits), in combination with all or a subset of the other circuits depicted in FIG. 1, can be considered a control circuit that performs the functions described herein. Such a control circuit can include hardware only or a combination of hardware and software (including firmware).

For example, a controller programmed by firmware to perform the functions described herein is one example of a control circuit. A control circuit can include a processor, a PGA (Programmable Gate Array), an FPGA (Field Programmable Gate Array), an ASIC (Application Specific Integrated Circuit), or another type of integrated circuit or circuit more generally.

The controller 122 interfaces with the one or more memory dies 108. In one embodiment, controller 122 and multiple memory dies (together comprising non-volatile storage system 100) implement an SSD, which can emulate, replace, or be used in place of a hard disk drive inside a host, as a network access storage (NAS) device, in a laptop, in a tablet, in a server, etc. Additionally, the SSD need not be made to work as a hard drive.

Some embodiments of the non-volatile storage system 100 may include one memory die 108 connected to one controller 122. Other embodiments may include multiple memory dies 108 in communication with one or more controllers 122. In one example, the multiple memory dies 108 can be grouped into a set of memory packages. Each memory package may include one or more memory dies 108 in communication with controller 122. In one embodiment, a memory package includes a printed circuit board (or similar structure) with one or more memory dies 108 mounted thereon. In some embodiments, a memory package can include molding material to encase the memory dies 108 of the memory package. In some embodiments, controller 122 is physically separate from any of the memory packages.

In one embodiment, a controller 122 is included in the same package (e.g., a removable storage card) as the memory die 108. In other embodiments, the controller is separated from the memory die 108. In some embodiments the controller is on a different die than the memory die 108. In some embodiments, one controller 122 communicates with multiple memory dies 108. In other embodiments, each memory die 108 has its own controller. Commands and data are transferred between a host 140 and controller 122 via a data bus 120, and between controller 122 and the memory die 108 via lines 118. In one embodiment, memory die 108 includes a set of input and/or output (I/O) pins that connect to lines 118.

The controller 122 includes one or more processors 122c, ROM 122a, random access memory (RAM) 122b, a memory interface (MI) 122d, and a host interface (HI) 122e, all of which may be interconnected. The storage devices (ROM 122a, RAM 122b) store code (software) such as a set of instructions (including firmware), and one or more of the processors 122c are operable to execute the set of instructions to provide functionality described herein (e.g., non-transitory computer readable storage medium). Alternatively or additionally, one or more processors 122c can access code from a storage device in the memory structure, such as a reserved area of memory cells connected to one or more wordlines. RAM 122b can be used to store data for controller 122, including caching program data (discussed below). MI 122d— in communication with ROM 122a, RAM 122b, and processor(s) 122c— may be an electrical circuit that provides an electrical interface between controller 122 and memory die 108. For example, MI 122d can change the format or timing of signals, provide a buffer, isolate from surges, latch I/O, etc. One or more processors 122c can issue commands to control circuitry 110 (or another component of memory die 108) via MI 122d. Host interface 122e provides an electrical interface with host 140 via data bus 120 in order to receive commands, addresses and/or data from host 140 to provide data and/or status to host 140.

Figure 2:
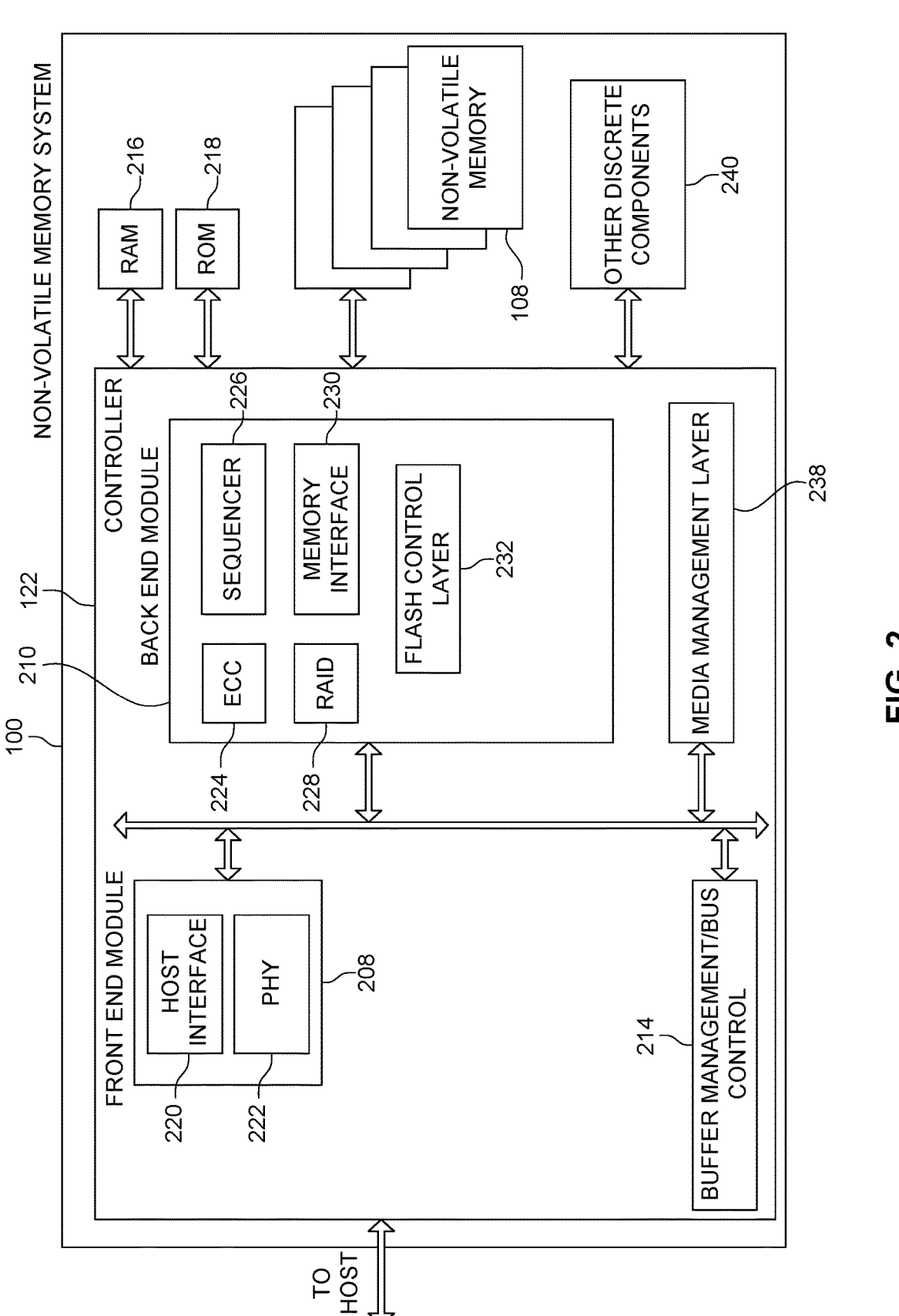
FIG. 2 is a block diagram of an example memory system, in connection with which, example embodiments of the disclosed technology can be implemented.

FIG. 2 is a block diagram of example memory system 100 that depicts more details of one embodiment of controller 122. While the controller 122 in the embodiment of FIG. 2 is a flash memory controller, it should be appreciated that the one or more non-volatile memory dies 108 are not limited to flash memory. Thus, the controller 122 is not limited to the particular example of a flash memory controller. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In an example operation, when a host needs to read data from or write data to the flash memory, it will communicate with the flash memory controller. If the host provides a logical address to which data is to be read/written, the flash memory controller can convert the logical address received from the host to a physical address in the flash memory. Alternatively, the host itself can provide the physical address. The flash memory controller can also perform various memory management functions including, but not limited to, wear leveling (distributing writes to avoid wearing out specific blocks of memory that would otherwise be repeatedly written to) and garbage collection (after a block is full, moving only the valid pages of data to a new block, so that the block can be erased and reused).

In some embodiments, non-volatile memory system 100 includes a single channel between controller 122 and non-volatile memory die 108. However, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if only a single channel is shown in the drawings.

As depicted in FIG. 2, controller 122 includes a front-end module 208 that interfaces with a host, a back-end module 210 that interfaces with the memory die 108, and various other modules that perform functions which will now be described in detail. The components of controller 122 depicted in FIG. 2 may take various forms including, without limitation, a packaged functional hardware unit (e.g., an electrical circuit) designed for use with other components, a portion of a program code (e.g., software or firmware) executable by a (micro) processor or processing circuitry that usually performs a particular function of related functions, a self-contained hardware or software component that interfaces with a larger system, or the like. For example, each module may include an ASIC, an FPGA, a circuit, a digital logic circuit, an analog circuit, a combination of discrete circuits, gates, or any other type of hardware or combination thereof. Alternatively or additionally, each module may include software stored in a processor readable device (e.g., memory) to program a processor to enable controller 122 to perform the functions described herein. The architecture depicted in FIG. 2 is one example implementation that may (or may not) use the components of controller 122 depicted in FIG. 1 (e.g., RAM, ROM, processor, interface).

Referring again to modules of the controller 122, a buffer manager/bus control 214 manages buffers in RAM 216 and controls the internal bus arbitration of controller 122. ROM 218 stores system boot code. Although illustrated in FIG. 2 as located separately from the controller 122, in other embodiments, one or both of RAM 216 and ROM 218 may be located within the controller. In yet other embodiments, portions of RAM 216 and ROM 218 may be located within the controller 122, while other portions may be located outside the controller. Further, in some implementations, the controller 122, RAM 216, and ROM 218 may be located on separate semiconductor dies.

Front-end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fiber Channel, USB, PCIe, and NVMe. The host interface 220 typically facilitates transfer for data, control signals, and timing signals.

Back-end module 210 includes an error correction code (ECC) engine 224 that encodes the data bytes received from the host, and decodes and error corrects the data bytes read from the non-volatile memory die 108. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as one or more extra dies, or may be added within the existing die, e.g., as an extra plane, an extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or greater interface. A flash control layer 232 controls the overall operation of back-end module 210.

Additional components of system 100 illustrated in FIG. 2 include media management layer (MML) 238, which performs wear leveling of memory cells of non-volatile memory die 108, as well as, other discrete components 240, such as external electrical interfaces, external RAM, resistors, capacitors, or other components that may interface with controller 122. In alternative embodiments, one or more of the physical layer interface 222, RAID module 228, MML 238, or buffer management/bus controller 214 are optional components.

MML 238 (e.g., Flash Translation Layer (FTL)) may be integrated as part of the flash management for handling flash errors and interfacing with the host. In particular, MML 238 may be a module in flash management and may be responsible for the internals of NAND management. In particular, MML 238 may include an algorithm in the memory device firmware which translates writes from the host into writes to the memory 126 of die 108. MML 238 may be needed because: 1) the memory structure 126 may have limited endurance; 2) the memory 126 may only be written in multiples of pages; and/or 3) the memory structure 126 may not be written unless it is erased as a block (or a tier within a block in some embodiments). MML 238 understands these potential limitations of the memory structure 126 which may not be visible to the host. Accordingly, MML 238 attempts to translate the writes from host into writes into the memory structure 126.

Figure 3:
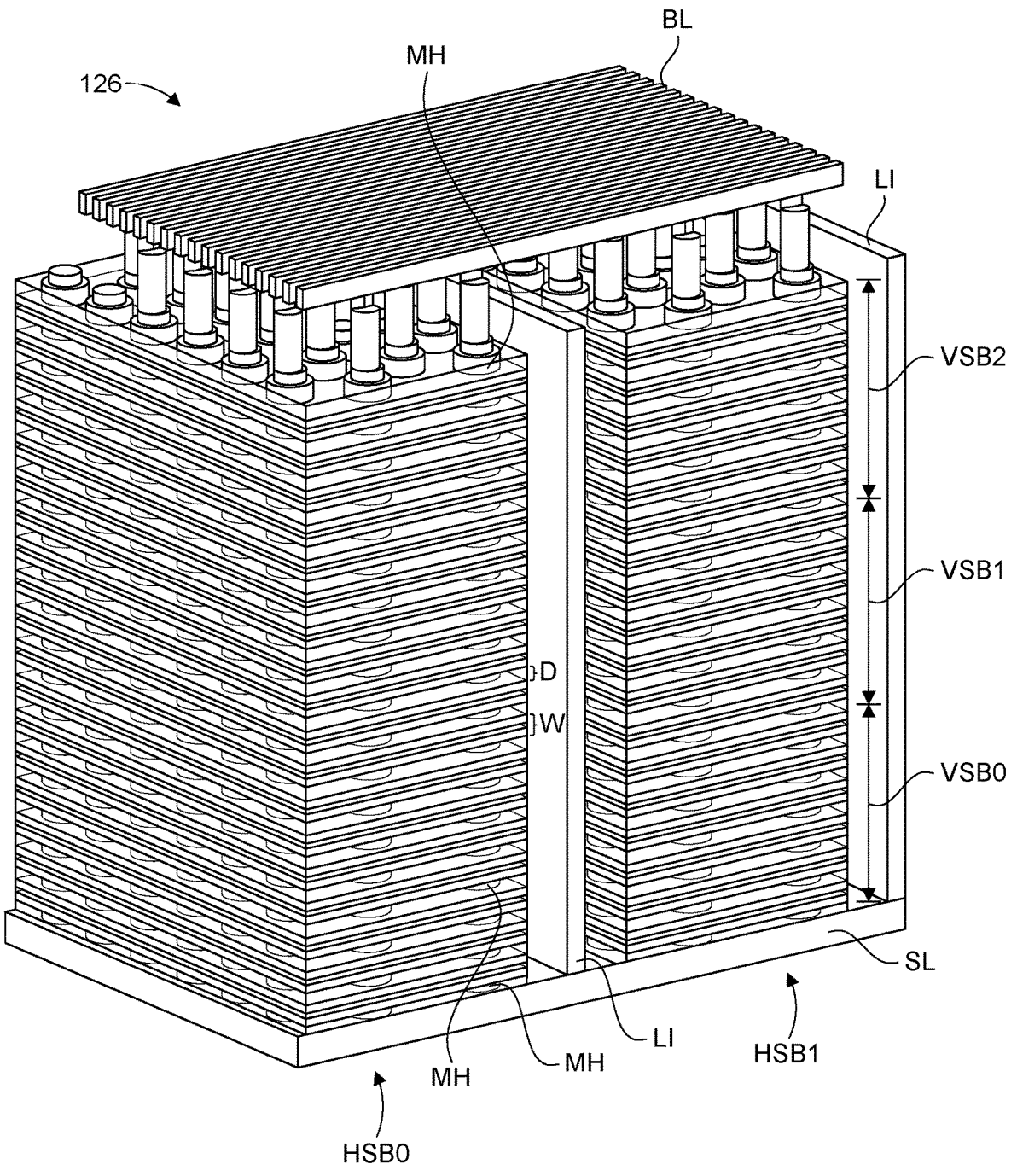
FIG. 3 is a perspective view of a portion of an example monolithic three-dimensional memory structure, in connection with which, example embodiments of the disclosed technology can be implemented.

FIG. 3 is a perspective view of a portion of a monolithic 3D memory array that includes a plurality of non-volatile memory cells, and that can comprise memory structure 126 in one embodiment. FIG. 3 illustrates, for example, a portion of one block of memory. The structure depicted includes a set of bitlines (BLs) positioned above a stack of alternating dielectric layers and conductive layers. For example purposes, one of the dielectric layers is marked as D and one of the conductive layers (i.e., wordline layers) is marked as WL. The number of alternating dielectric and conductive layers can vary based on specific implementation requirements. In some embodiments, the 3D memory array includes between 108-300 alternating dielectric and conductive layers. One example embodiment includes 96 data wordline layers, 8 select layers, 6 dummy wordline layers, and 110 dielectric layers. More or less than 108-300 layers can also be used. Data wordline layers include data memory cells. Dummy wordline layers include dummy memory cells. As will be explained below, the alternating dielectric and conductive layers are divided into four "fingers" by local interconnects LI. FIG. 3 shows two fingers and two local interconnects LI. Below the alternating D layers and WL layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 126 is provided below with respect to FIG. 4A-4G.

One of the local interconnects LI separates the block into two horizontal sub-blocks HSB0, HSB1. The block comprises multiple vertical sub-blocks VSB0, VSB1, VSB2. The vertical sub-blocks VSB0, VSB1, VSB2 can also be referred to as "tiers." Each vertical sub-block extends across the block, in one embodiment. Each horizontal sub-block HSB0, HSB1 in the block is a part of vertical sub-block VSB0. Likewise, each horizontal sub-block HSB0, HSB1 in the block is a part of vertical sub-block VSB1. Likewise, each horizontal sub-block HSB0, HSB1 in the block is a part of vertical sub-block VSB2. For purpose of discussion, vertical sub-block VSB0 will be referred to as a lower vertical sub-block, vertical sub-block VSB1 will be referred to as a middle vertical sub-block, and VSB2 will be referred to as an upper vertical sub-block. In one embodiment, there are two vertical sub-blocks in a block. There could be four or more vertical sub-blocks in a block.

A memory operation for a vertical sub-block may be performed on memory cells in one or more horizontal sub-blocks. For example, a programming operation of memory cells in vertical sub-block VSB0 may include: programming memory cells in horizontal sub-block HSB0 but not horizontal sub-block HSB1; programming memory cells in horizontal sub-block HSB1 but not horizontal sub-block HSB0; or programming memory cells in both horizontal sub-block HSB0 and horizontal sub-block HSB1.

The different vertical sub-blocks VSB0, VSB1, VSB2 are treated as separate units for erase/program purposes, in one embodiment. For example, the memory cells in one vertical sub-block can be erased while leaving valid data in the other vertical sub-blocks. Then, memory cells in the erased vertical sub-block can be programmed while valid data remains in the other vertical sub-blocks. In some cases, memory cells in the middle vertical sub-block VSB1 are programmed while there is valid data in the lower vertical sub-block VSB0 and/or the upper vertical sub-block VSB2. Programming the memory cells in middle vertical sub-block VSB1 presents challenges due to the valid data in the other vertical sub-blocks VSB0, VSB2.

Figure 4A:
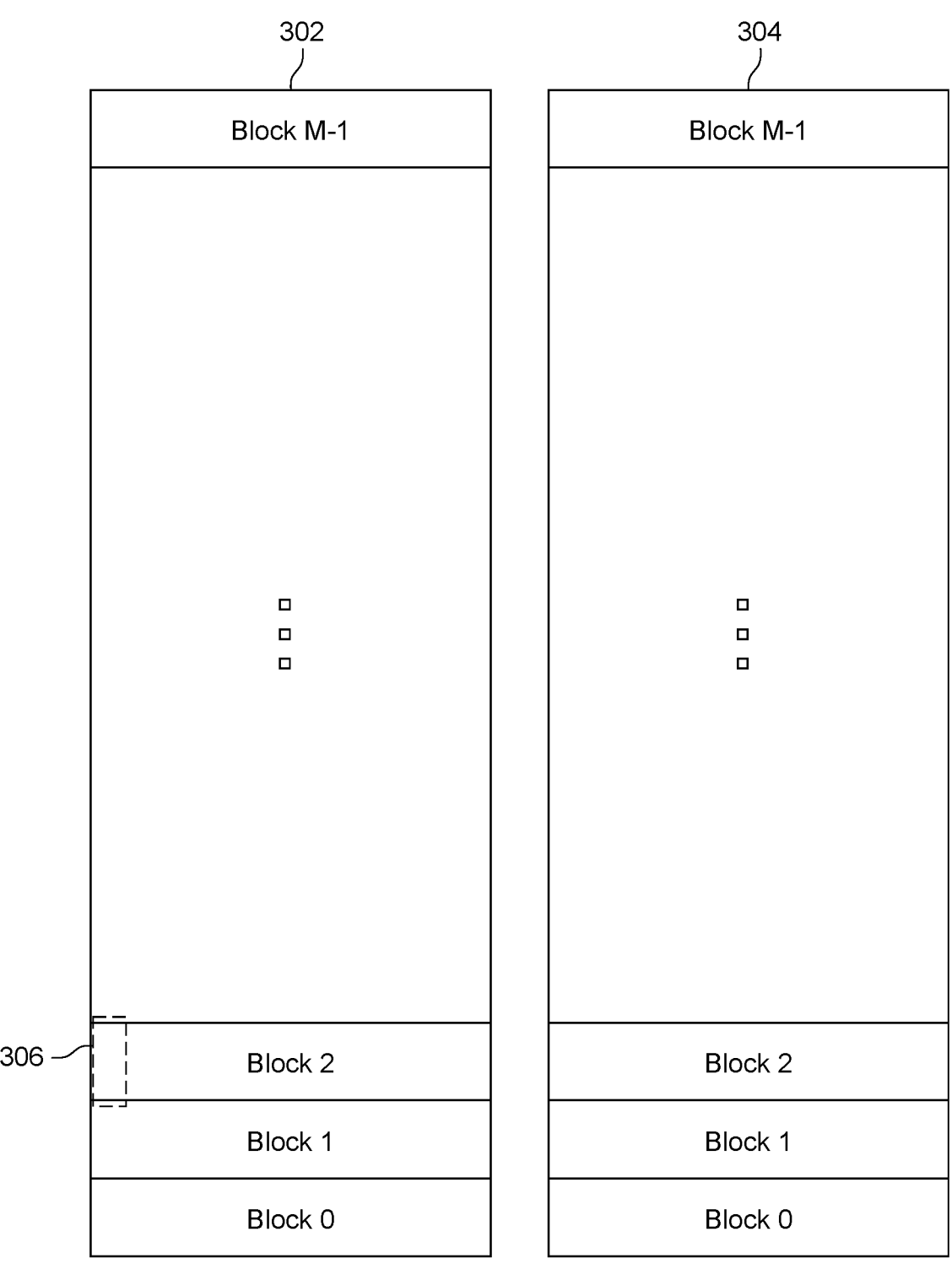
FIG. 4A is a block diagram of an example memory structure having two planes, in connection with which, example embodiments of the disclosed technology can be implemented.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits. In some embodiments, a block represents a groups of connected memory cells as the memory cells of a block share a common set of wordlines.

Figure 4B:
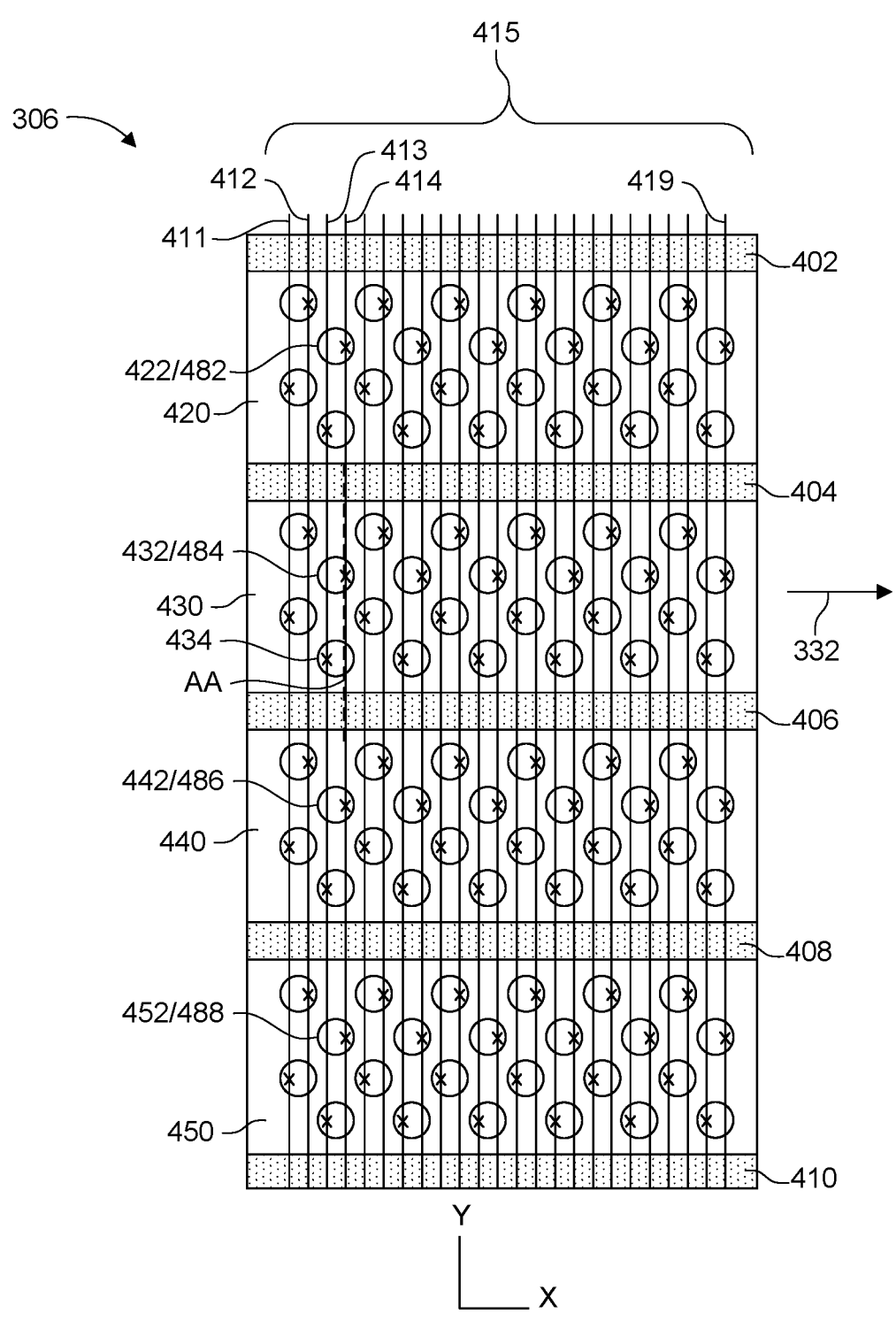
FIG. 4B depicts a top view of a portion of a block of example memory cells, in connection with which, example embodiments of the disclosed technology can be implemented.

FIGS. 4B-4F depict an example three dimensional ("3D") NAND structure that corresponds to the structure of FIG. 3 and can be used to implement memory structure 126 of FIG. 2. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 332, the block includes more vertical columns than depicted in FIG. 4B.

FIG. 4B also depicts a set of bitlines 415, including bitlines 411, 412, 413, 414, . . . 419. FIG. 4B shows twenty-four bitlines because only a portion of the block is depicted. It is contemplated that more than twenty-four bitlines connected to vertical columns of the block. Each of the circles representing vertical columns has an "x" to indicate its connection to one bitline. For example, bitline 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as wordline fingers that are separated by the local interconnects. In one embodiment, the wordline fingers on a common level of a block connect together to form a single wordline. In another embodiment, the wordline fingers on the same level are not connected together. In one example implementation, a bitline only connects to one vertical column in each of regions 420, 430, 440 and 450. In that implementation, each block has sixteen rows of active columns and each bitline connects to four rows in each block. In one embodiment, all of four rows connected to a common bitline are connected to the same wordline (via different wordline fingers on the same level that are connected together); therefore, the system uses the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block. FIG. 4B also shows the vertical columns being staggered. In other embodiments, different patterns of staggering can be used. In some embodiments, the vertical columns are not staggered.

Figure 4C:
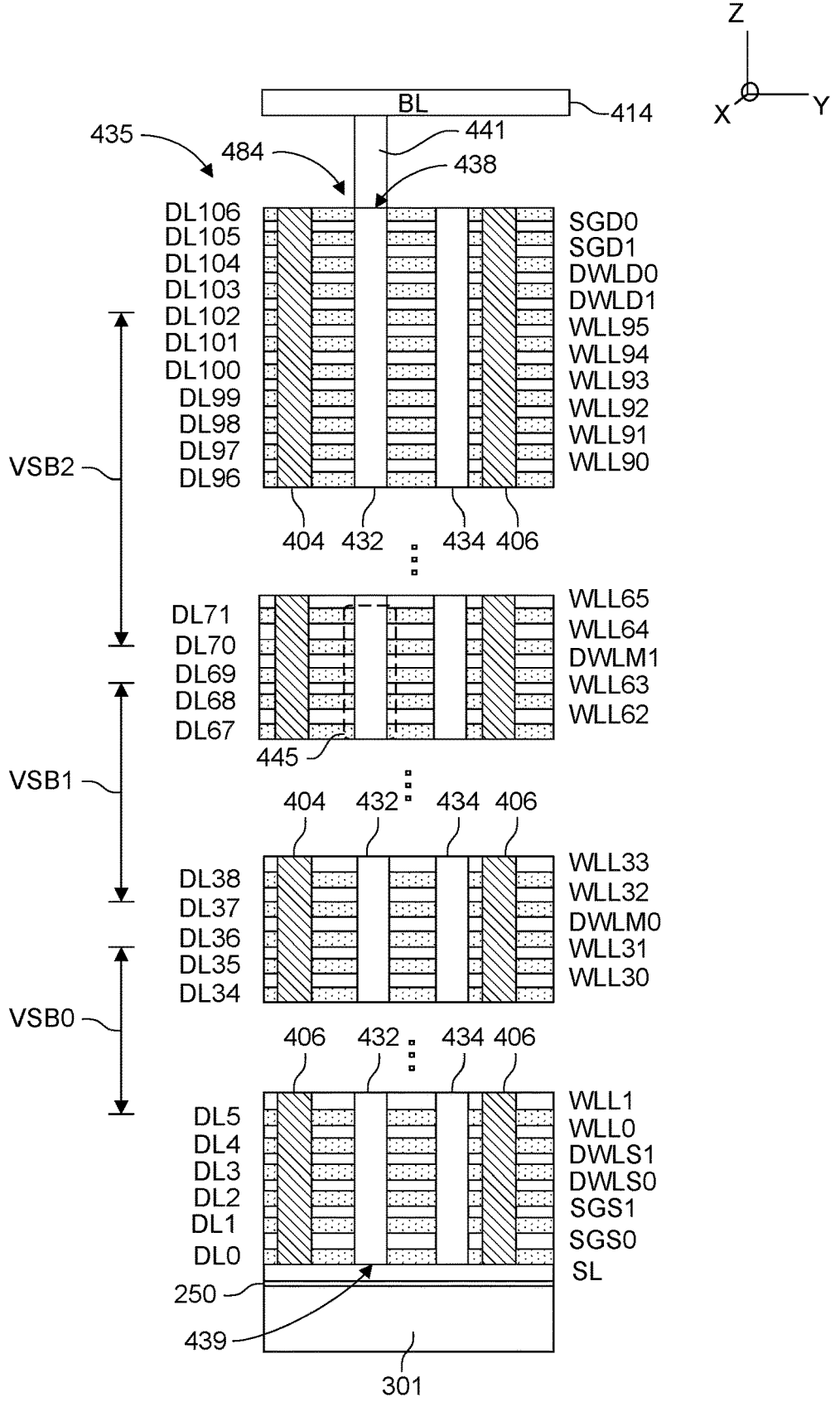
FIG. 4C depicts a stack showing a cross-sectional view along line AA of FIG. 4B.

FIG. 4C depicts an embodiment of a stack 435 showing a cross-sectional view along line AA of FIG. 4B. Two SGD layers (SGD0, SDG1), two SGS layers (SGS0, SGS1) and six dummy wordline layers DWLD0, DWLD1, DWLM1, DWLM0, DWLS0 and DWLS1 are provided, in addition to the data wordline layers WLL0-WLL95. Each NAND string has a drain side select transistor at the SGD0 layer and a drain side select transistor at the SGD1 layer. In operation, the same voltage may be applied to each layer (SGD0, SGD1), such that the control terminal of each transistor receives the same voltage. Each NAND string has a source side select transistor at the SGS0 layer and a drain side select transistor at the SGS1 layer. In operation, the same voltage may be applied to each layer (SGS0, SGS1), such that the control terminal of each transistor receives the same voltage. Also depicted are dielectric layers DL0-DL106.

Columns 432, 434 of memory cells are depicted in the multi-layer stack. The stack includes a substrate 301, an insulating film 250 on the substrate, and a portion of a source line SL. A portion of the bitline 414 is also depicted. Note that NAND string 484 is connected to the bitline 414. NAND string 484 has a source-end 439 at a bottom of the stack and a drain-end 438 at a top of the stack. The source-end 439 is connected to the source line SL. A conductive via 441 connects the drain-end 438 of NAND string 484 to the bitline 414. Local interconnects 404 and 406 comprising metal-filled slits from FIG. 4B are also depicted.

The stack 435 is divided into three vertical sub-blocks (VSB0, VSB1, VSB2). Vertical sub-block VSB0 includes WLL0-WLL31. The following layers could also be considered to be a part of vertical sub-block VSB0 (SGS0, SGS1, DWLS0, DWLS1). Vertical sub-block VSB1 includes WLL32-WLL63. Vertical sub-block VSB2 includes WLL64-WLL95. The following layers could also be considered to be a part of vertical sub-block VSB2 (SGD0, SGD1, DWLD0, DWLD1). Each NAND string has a set of data memory cells in each of the vertical sub-blocks. Dummy wordline layer DMLM0 is between vertical sub-block VSB0 and vertical sub-block VSB1. Dummy wordline layer DMLM1 is between vertical sub-block VSB1 and vertical sub-block VSB2. The dummy wordline layers have dummy memory cell transistors that may be used to electrically isolate a first set of memory cell transistors within the memory string (e.g., corresponding with vertical sub-block VSB0 wordlines WLL0-WLL31) from a second set of memory cell transistors within the memory string (e.g., corresponding with the vertical sub-block VSB1 wordlines WLL32-WLL63) during a memory operation (e.g., an erase operation or a programming operation).

In another embodiment, one or more middle junction transistor layers are used to divide the stack 435 into vertical sub-blocks. A middle junction transistor layer contains junction transistors, which do not necessarily contain a charge storage region. Hence, a junction transistor is typically not considered to be a dummy memory cell. Both a junction transistor and a dummy memory cell may be referred to herein as a "non-data transistor." A non-data transistor, as the term is used herein, is a transistor on a NAND string, wherein the transistor is either configured to not store user or system data or operated in such a way that the transistor is not used to store user data or system data. A wordline that is connected to non-data transistors is referred to herein as a non-data wordline. Examples of non-data wordlines include, but are not limited to, dummy wordlines, and a select line in a middle junction transistor layer.

The stack 435 may have more than three vertical sub-blocks. For example, the stack 435 may be divided into four, five or more vertical sub-blocks. Each of the vertical sub-block contains at least one data memory cell. There may additional layers similar to the middle dummy wordline layers DWLM in order to divide the stack 435 into the additional vertical sub-blocks. In one embodiment, the stack has two vertical sub-blocks.

Figure 4D:
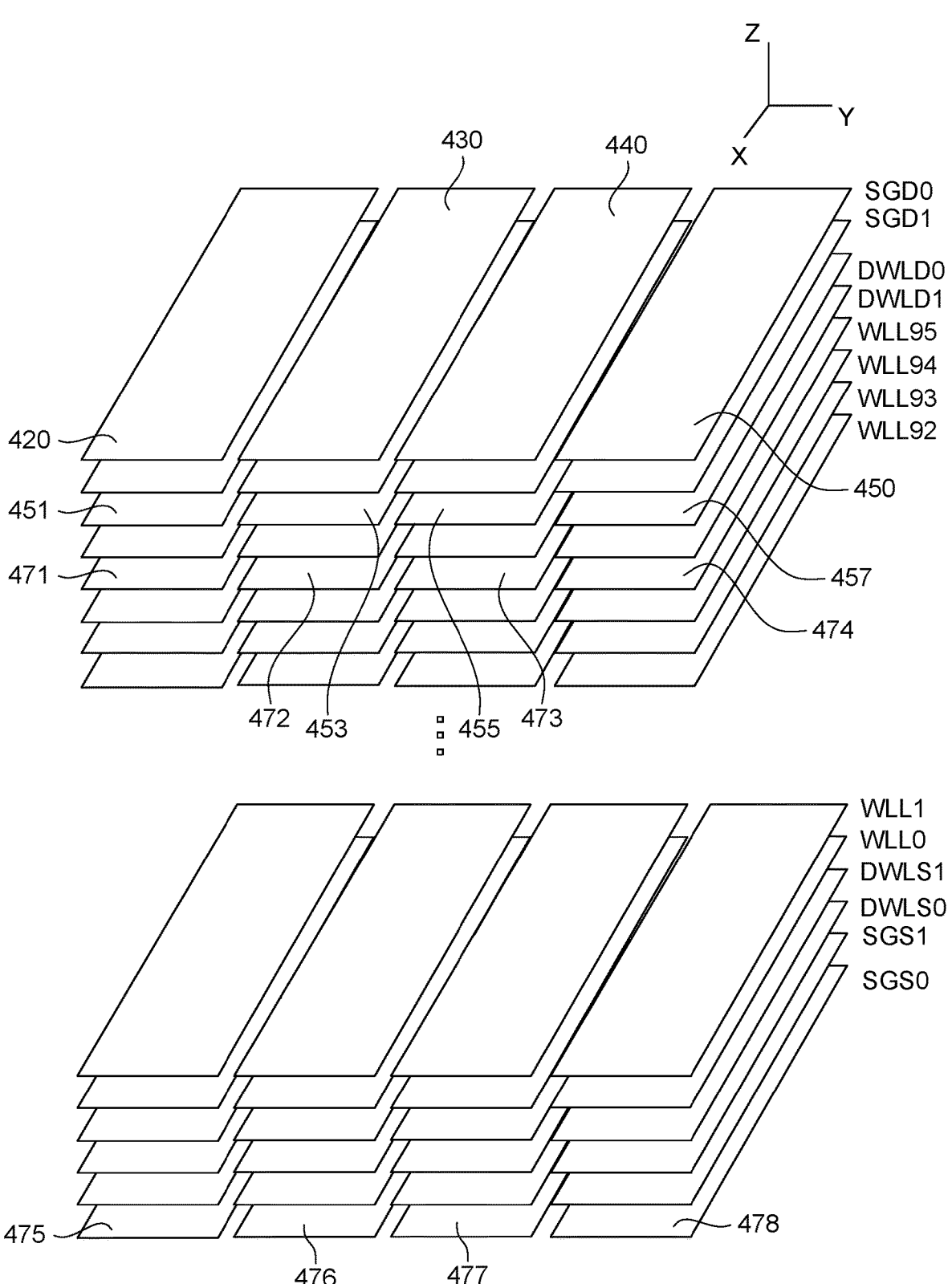
FIG. 4D depicts an alternative view of the select gate layers and wordline layers.

FIG. 4D depicts an alternative view of the SG layers and wordline layers of the stack 435 of FIG. 4C. The SGD layers SGD0 and SGD0 (the drain-side SG layers) each includes parallel rows of SG lines associated with the drain-side of a set of NAND strings. For example, SGD0 includes drain-side SG regions 420, 430, 440 and 450, consistent with FIG. 4B.

Below the SGD layers are the drain-side dummy wordline layers. Each dummy wordline layer represents a wordline, in one approach, and is connected to a set of dummy memory cells at a given height in the stack. For example, DWLD0 comprises wordline layer regions 451, 453, 455 and 457. A dummy memory cell, also referred to as a non-data memory cell, does not store data and is ineligible to store data, while a data memory cell is eligible to store data. Moreover, the Vth of a dummy memory cell is generally fixed at the time of manufacturer or may be periodically adjusted, while the Vth of the data memory cells changes more frequently, e.g., during erase and programming operations of the data memory cells.

Below the dummy wordline layers are the data wordline layers. For example, WLL95 comprises wordline layer regions 471, 472, 473 and 474. Below the data wordline layers are the source-side dummy wordline layers. Below the source-side dummy wordline layers are the SGS layers. The SGS layers SGS0 and SGS1 (the source-side SG layers) each includes parallel rows of SG lines associated with the source-side of a set of NAND strings. For example, SGS0 includes source-side SG lines 475, 476, 477 and 478. Each SG line can be independently controlled, in one approach. Or, the SG lines can be connected and commonly controlled.

Figure 4E:
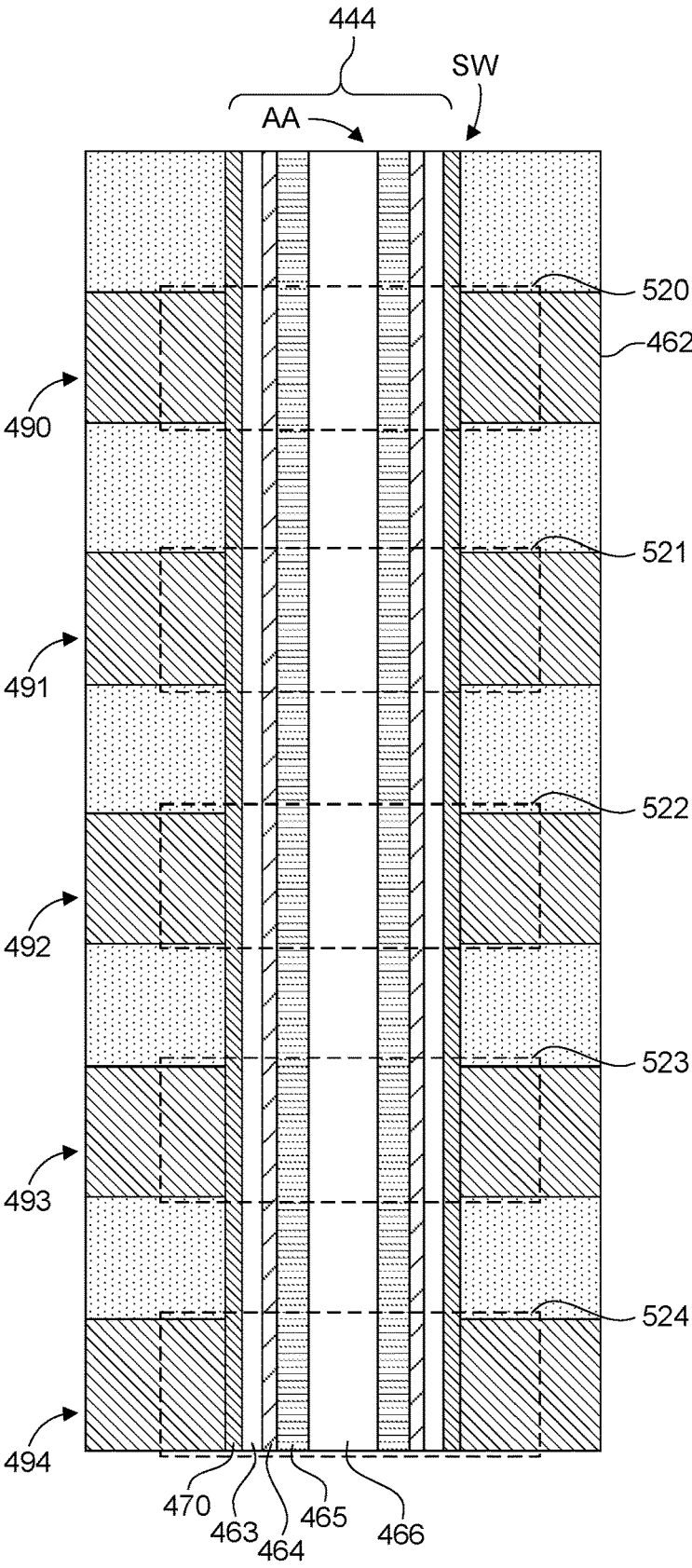
FIG. 4E depicts a view of the region 445 of FIG. 4C.

FIG. 4E depicts a view of the region 445 of FIG. 4C. Data memory cell transistors 520 and 521 are above dummy memory cell transistor 522. Below dummy memory cell transistor 522 are data memory cell transistors 523 and 524.

A number of layers can be deposited along the sidewall (SW) of the memory hole 444 and/or within each wordline layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A wordline layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel. For example, in one embodiment, the erase operation includes removing electrons from the floating gate in order to change the state of the cell to 1. During the erase operation, a large negative voltage is required to repel electrons from the floating gate. This can be accomplished by grounding the control gate and applying a high voltage (e.g., about 18V or more) to the substate. As a result, electrons are removed from the floating gate due to the FN tunneling effect.

Non-data transistors (e.g., select transistors, dummy memory cell transistors) may also include the charge trapping layer 463. In FIG. 4E, dummy memory cell transistor 522 includes the charge trapping layer 463. Thus, the threshold voltage of at least some non-data transistors may also be adjusted by storing or removing electrons from the charge trapping layer 463. It is not required that all non-data transistors have an adjustable Vth. For example, the charge trapping layer 463 is not required to be present in every select transistor.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4F:
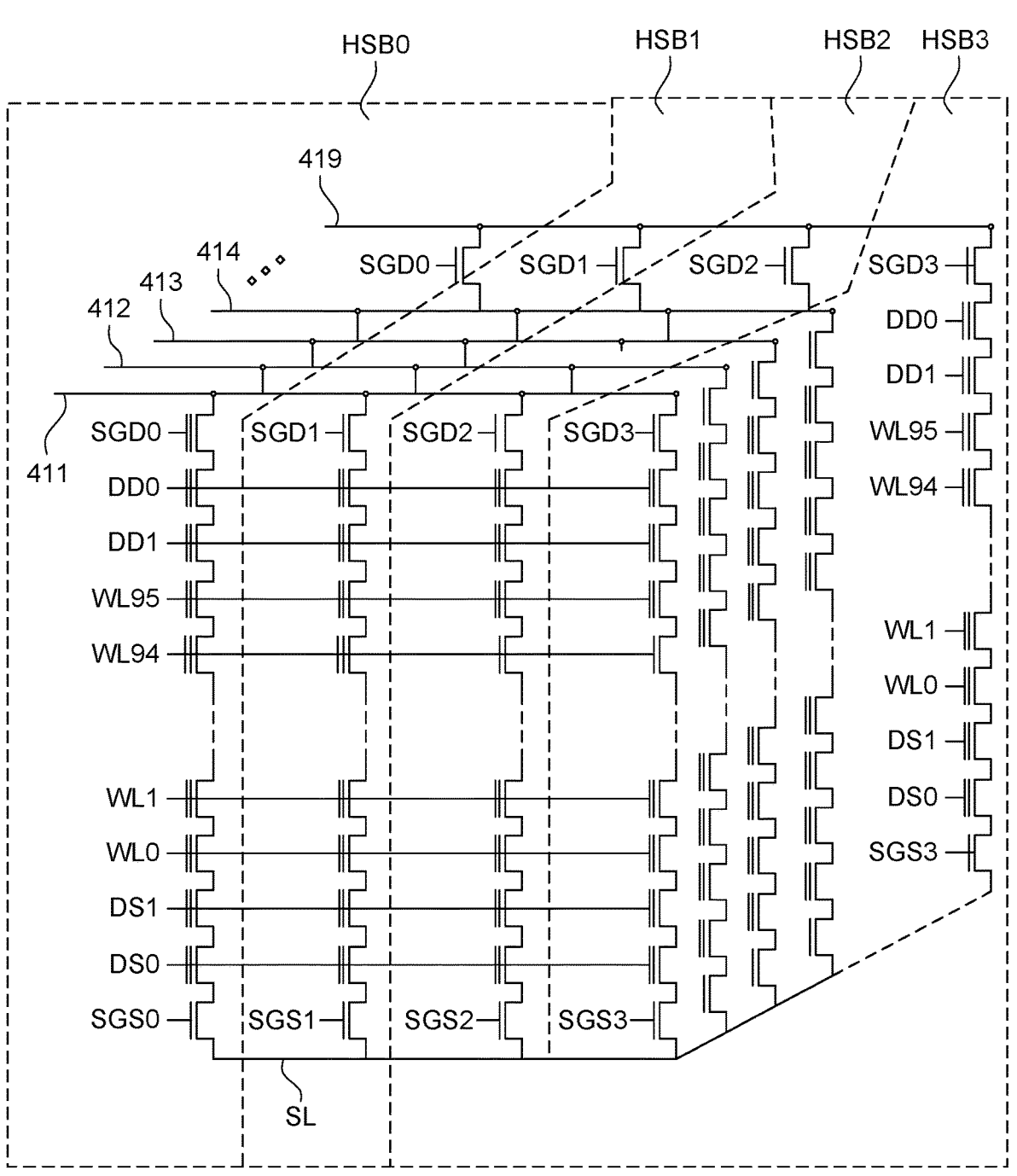
FIG. 4F is a schematic of a plurality of example NAND strings showing multiple horizontal sub-blocks, in connection with which, example embodiments of the disclosed technology can be implemented.

FIG. 4F is a schematic diagram of a portion of the memory depicted in FIGS. 3-4E. FIG. 4F shows physical wordlines WLL0-WLL95 running across the entire block. The structure of FIG. 4F corresponds to portion 306 in Block 2 of FIGS. 4A-E, including bitlines 411, 412, 413, 414, . . . 419. Within the block, each bitline is connected to four NAND strings. Drain side selection lines SGD0, SGD1, SGD2 and SGD3 are used to determine which of the four NAND strings connect to the associated bitline(s). Source side selection lines SGS0, SGS1, SGS2 and SGS3 are used to determine which of the four NAND strings connect to the common source line. The block can also be thought of as divided into four horizontal sub-blocks HSB0, HSB1, HSB2 and HSB3. Horizontal sub-block HSB0 corresponds to those vertical NAND strings controlled by SGD0 and SGS0, Horizontal sub-block HSB1 corresponds to those vertical NAND strings controlled by SGD1 and SGS1, Horizontal sub-block HSB2 corresponds to those vertical NAND strings controlled by SGD2 and SGS2, and Horizontal sub-block HSB3 corresponds to those vertical NAND strings controlled by SGD3 and SGS3.

Figure 4G:
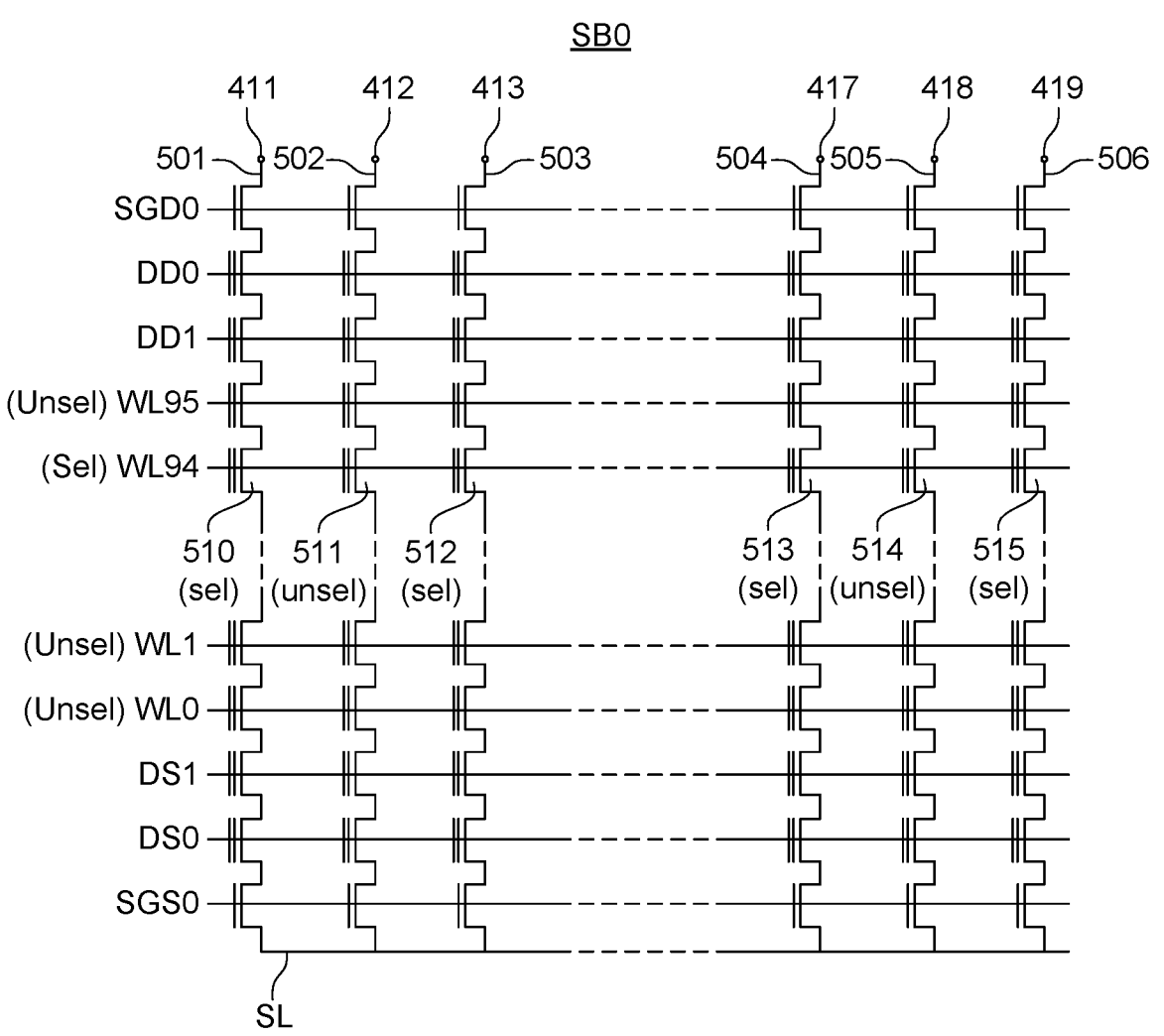
FIG. 4G is a schematic of horizontal sub-block HSB0.

FIG. 4G is a schematic of horizontal sub-block HSB0. Horizontal sub-blocks HSB1, HSB2 and HSB3 have similar structures. FIG. 4G shows physical wordlines WL0-WL95 running across the entire sub-block S0. All of the NAND strings of sub-block S0 are connected to SGD0 and SGS0. FIG. 4G only depicts six NAND stings 501, 502, 503, 504, 505 and 506; however, horizontal sub-block HSB0 will have thousands of NAND strings (e.g., 15,000 or more).

FIG. 4G is being used to explain the concept of a selected memory cell. A memory operation is an operation designed to use the memory for its purpose and includes one or more of reading data, writing/programming data, erasing memory cells, refreshing data in memory cells, and the like. During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory architecture, the memory type, and the memory operation, unselected memory cells may be actively or passively excluded from being subjected to the memory operation.

As an example of selected memory cells and unselected memory cells, during a programming process, the set of memory cells intended to take on a new electrical characteristic (or other characteristic) to reflect a changed programming state are referred to as the selected memory cells while the memory cells that are not intended to take on a new electrical characteristic (or other characteristic) to reflect a changed programming state are referred to as the unselected memory cells. In certain situations, unselected memory cells may be connected to the same wordline as selected memory cells. Unselected memory cells may also be connected to different wordlines than selected memory cells. Similarly, during a reading process, the set of memory cells to be read are referred to as the selected memory cells while the memory cells that are not intended to be read are referred to as the unselected memory cells.

To better understand the concept of selected memory cells and unselected memory cells, assume a programming operation is to be performed and, for example purposes only, that wordline WL94 and horizontal sub-block HS0 are selected for programming (see FIG. 4G). That means that all of the memory cells connected to WL94 that are in horizontal sub-blocks HSB1, HSB2 and HSB3 (the other horizontal sub-blocks) are unselected memory cells. Some of the memory cells connected to WL94 in horizontal sub-block HS0 are selected memory cells and some of the memory cells connected to WL94 in horizontal sub-block HS0 are unselected memory cells depending on how the programming operation is performed and the data pattern being programmed. For example, those memory cells that are to remain in the erased state S0 will be unselected memory cells, because their programming state will not change in order to store the desired data pattern, while those memory cells that are intended to take on a new electrical characteristic (or other characteristic) to reflect a changed programming state (e.g., programmed to states S1-S7) are selected memory cells. Looking at FIG. 4G, assume for example purposes, that memory cells 511 and 514 (which are connected to wordline WL94) are to remain in the erased state; therefore, memory cells 511 and 514 are unselected memory cells (labeled unsel in FIG. 4G). Additionally, assume for example purposes that memory cells 510, 512, 513 and 515 (which are connected to wordline WL94) are to be programmed to any of the data states S1-S7; therefore, memory cells 510, 512, 513 and 515 are selected memory cells (labeled sel in FIG. 4G).

Although the example memory system of FIGS. 3-4G is a three dimensional memory structure that includes vertical NAND strings with charge-trapping material, other (2D and 3D) memory structures can also be used with the technology described herein.

Figure 5:
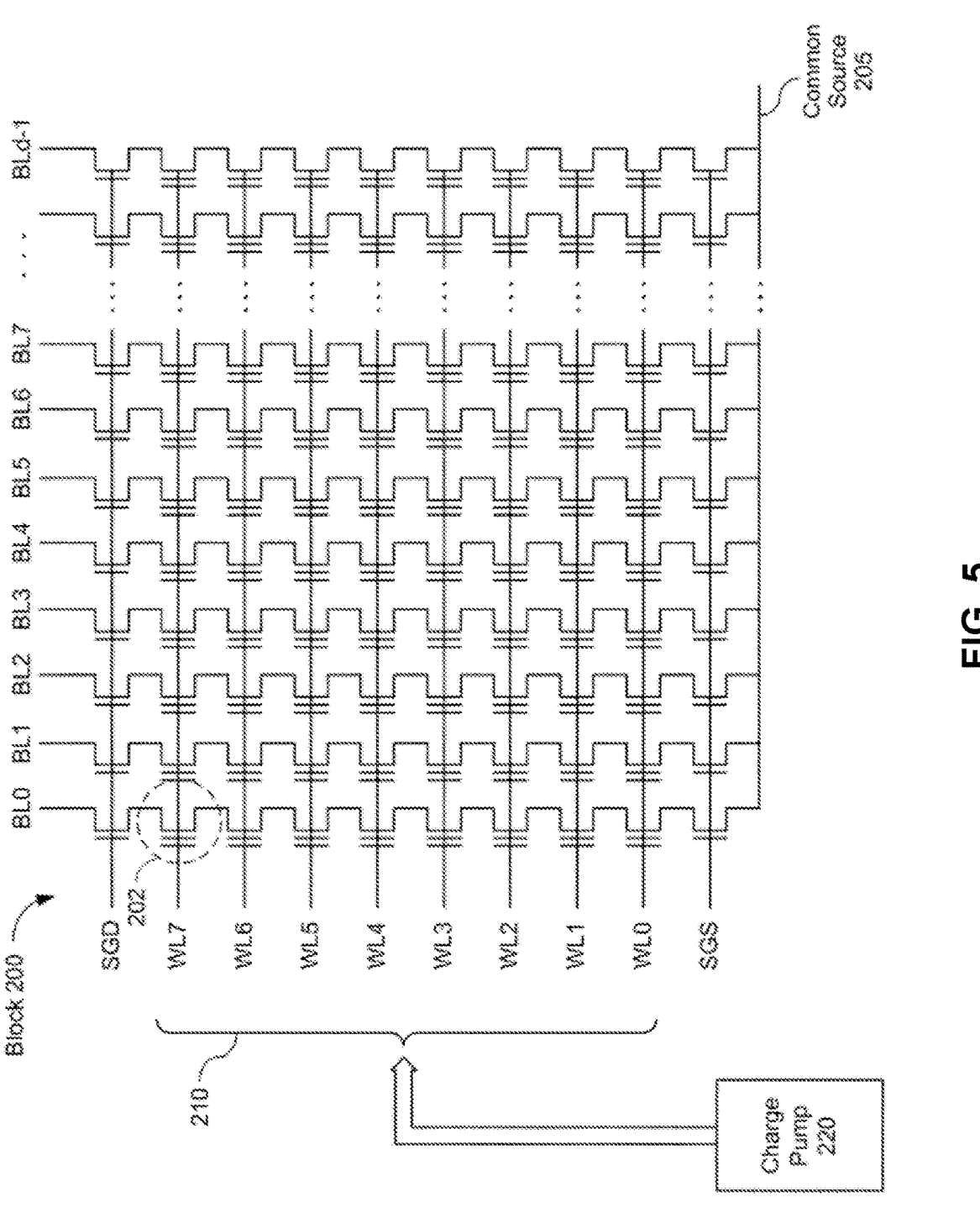
FIG. 5 is an example illustration of a block of memory cells, according to one embodiment.

FIG. 5 depicts a block 500 of memory cells. The block 500 can be one of many such blocks in the memory structure 126. The memory cells communicate with respective word lines WL0-WL7 (510), respective bit lines BL0-Bd-1, and a common source line 555. In the example provided, eight memory cells are connected in series to form a NAND string, and there are eight data word lines WL0 through WL. One terminal of each NAND string is connected to a corresponding bit line via a drain select gate (connected to select gate drain line SGD), and another terminal is connected to a common source 555 via a source select gate (connected to select gate source line SGS). Thus, the common source 555 is coupled to each NAND string.

In an erase operation, a high voltage (e.g., 20 V) may be applied to a substrate on which the NAND string is formed to remove charge from the memory cells. During a programming operation, a voltage (e.g., in the range of 12-21 V) may be applied to a selected word line. In one approach, stepwise increasing program pulses are applied until a memory cell is verified to have reached an intended state. Moreover, pass voltages at a lower level may be applied concurrently to the unselected word lines. In read and verify operations, the select gates (SGD and SGS) may be connected to a voltage (e.g., in the range of 2.5 to 4.5 V) and the unselected word lines may be raised to a read pass voltage (e.g., in the range of 4.5 to 6 V) to make the transistors operate as pass gates. The selected word line is connected to a voltage, a level of which is specified for each read and verify operation, to determine whether a threshold voltage of the concerned memory cell is above or below such level.

The voltage levels described above may be higher than an available supply voltage of the memory structure 126. To accommodate such voltage levels, a charge pump 520 is used. The charge pump 520 may provide such voltages at different levels during erase, program, or read operations for the memory cells of block 500. The output of the charge pump 520 may be used to provide different voltages concurrently to different word lines or groups of word lines. It is also possible to use multiple charge pumps 520 to supply different word line voltages. Similarly, the output from a charge pump can be provided to a bit line or other location as needed in the memory device.

Charge Pumps are important building blocks for NAND memory devices. As noted above, they may be used for providing appropriate bias voltage levels for performing erase, program, and read operations. Charge pumps convert a fixed input voltage to a higher output voltage to meet biasing requirements. Most of the power consumed by charge pumps employed to bias an array of memory cells may be during a ramp-phase. This is so because a charge pump typically needs to charge a very high capacitor from a reset voltage to a target voltage level. The charge pump 520, as described herein, improves efficiency such that power consumption can be reduced, directly affecting the overall current consumption of a device during memory operations.

Figure 6:
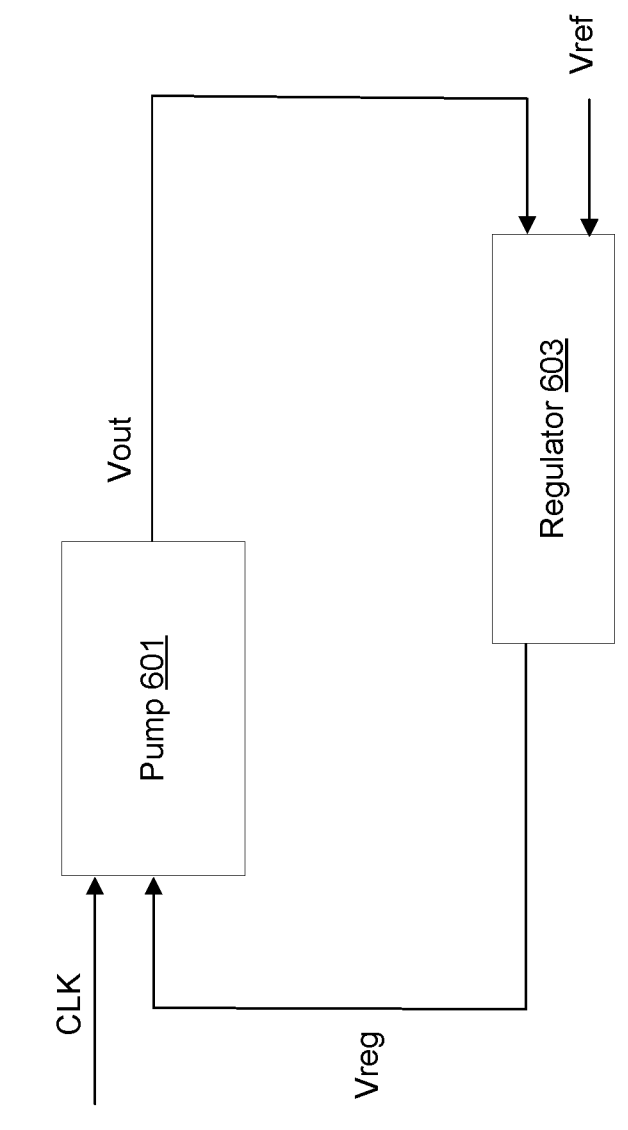
FIG. 6 is an example of a top-level block diagram of a typical charge pump arrangement, according to one embodiment.

FIG. 6 is an example of a top-level block diagram of a typical charge pump 600. The charge pump 600 includes a pump 601 and a regulator 603. Conventional charge pumps typically include both the pump 601 and the regulator 603. However, in some embodiments a charge pump may include just the pump 601. The pump 601 is configured to receive two signals: a clock signal, and a voltage regulation (Vreg) signal. Both the clock signal and the Vreg signal are applied as inputs to the pump 601. The pump 601 outputs an output signal Vout. The high (Vdd) and low (ground) connections are not explicitly shown. The voltage Vreg is provided by the regulator block 603. The regulator receives a voltage input via an external source. The regulator block 603 regulates the value of Vreg such that the desired value of Vout can be obtained. The pump section 201 typically includes cross-coupled elements not shown.

More information on prior art charge pumps, such Dickson type pumps and charge pumps generally, can be found, for example, in "Charge Pump Circuit Design" by Pan and Samaddar, McGraw-Hill, 2006, or "Charge Pumps: An Overview", Pylarinos and Rogers, Department of Electrical and Computer Engineering University of Toronto, available on the webpage "www.eecg.toronto.edu/~kphang/ece1371/chargepumps.pdf". Further information on various other charge pump aspects and designs can be found in U.S. Pat. Nos. 5,436,587; 6,370,075; 6,556,465; 6,760,262; 6,801, 454; 6,922,096; 7,030,683; 7,135,910; 7,372,320; 7,368, 979; 7,443,735; and 7,440,342; US patent publications 2007-0139099-A1 and 2008-0024096-A1; and application Ser. No. 10/842,910 filed on May 10, 2004; Ser. No. 11/295,906 filed on Dec. 6, 2005; Ser. No. 11/303,387 filed on Dec. 16, 2005; Ser. No. 11/497,465 filed on Jul. 31, 2006; Ser. No. 11/523,875 filed on Sep. 19, 2006; Ser. Nos. 11/845,903 and 11/845,939, both filed Aug. 28, 2007; Ser. Nos. 11/955,221 and 11/995,237, both filed on Dec. 12, 2007; and Ser. No. 12/135,945, filed Jun. 9, 2008.

When operating, the charge pump 600 tries to accurately maintain Vout at the desired level as part of the regulation process. However, when the output is initially connected to drive a load, Vout will typically drop below the desired value and then come back up and recover to the desired value (the recovery phase). Once back up to the desired range for Vout, the pump 601 tries to maintain the output in this range (the regulation phase). In the prior art, pumps are generally designed to recovery as quickly as is practically possible— or, perhaps more typically, to at least recover more quickly than some minimum value-since the purpose of the charge pump is to maintain the desired Vout value while supply the needed current.

Figure 7:
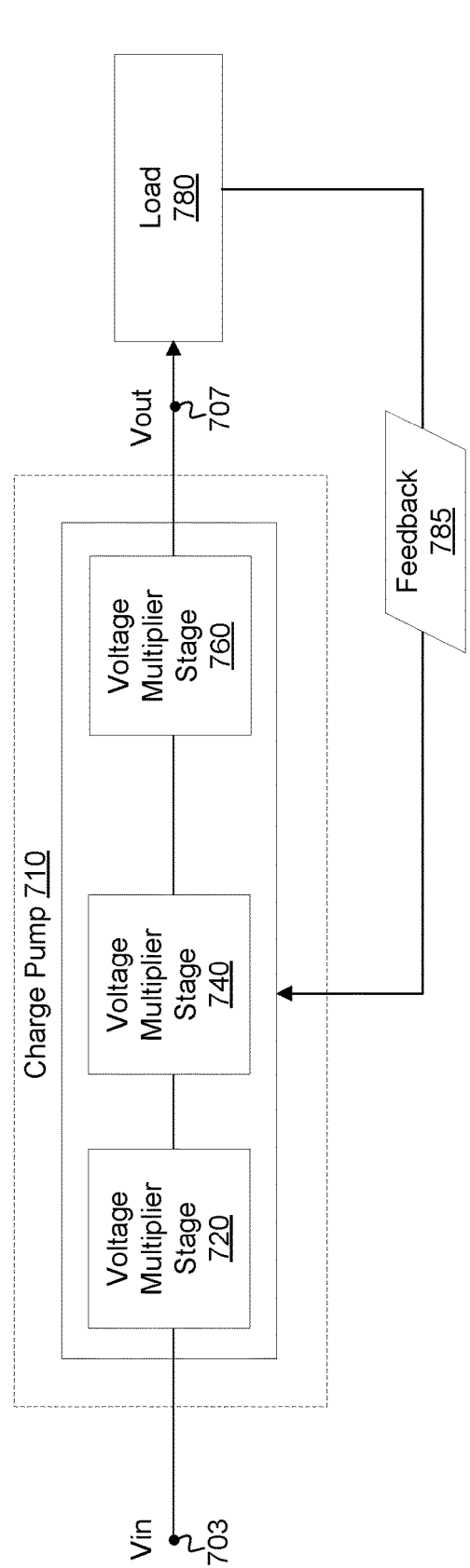
FIG. 7 is an example illustration of a typical charge pump, according to one embodiment.

The output of the pump 601 will typically be used by many elements on a device. Thus, in previous charge pump arrangements, the pump design would be optimized to meet a given recovery specification for the worst case conditions. All of the timing parameters would correspondingly be optimized to accommodate these worst case conditions, as having too slow a recovery specification would negatively affect device performance. As noted above, however, as the output of the charge pump is delivered to elements of the circuit with differing loads and connected to the pump by different paths, the resultant ramp rate for a given pump clock frequency can differ. FIG. 7 is an example illustration of a multi-staged charge pump 700. The multi-staged charge pump 700 receives an input voltage $V_{in}$ at node 703 and provides an output at node 707 at a higher voltage Vout by boosting the input voltage progressively in a series of voltage multiplier stages (e.g., stages 720, 740, 760). The voltage output is supplied to a load 780, for example the word line of circuit 500 described in FIG. 5. Referring again to FIG. 7, the figure also shows a feedback signal 785 from the load to the charge pump 710, but without explicitly showing the regulator block 603. Most charge pump arrangements will typically have two such branches of one or more stage that alternately provide Vout as the clock signals alternate.

Figure 8A:
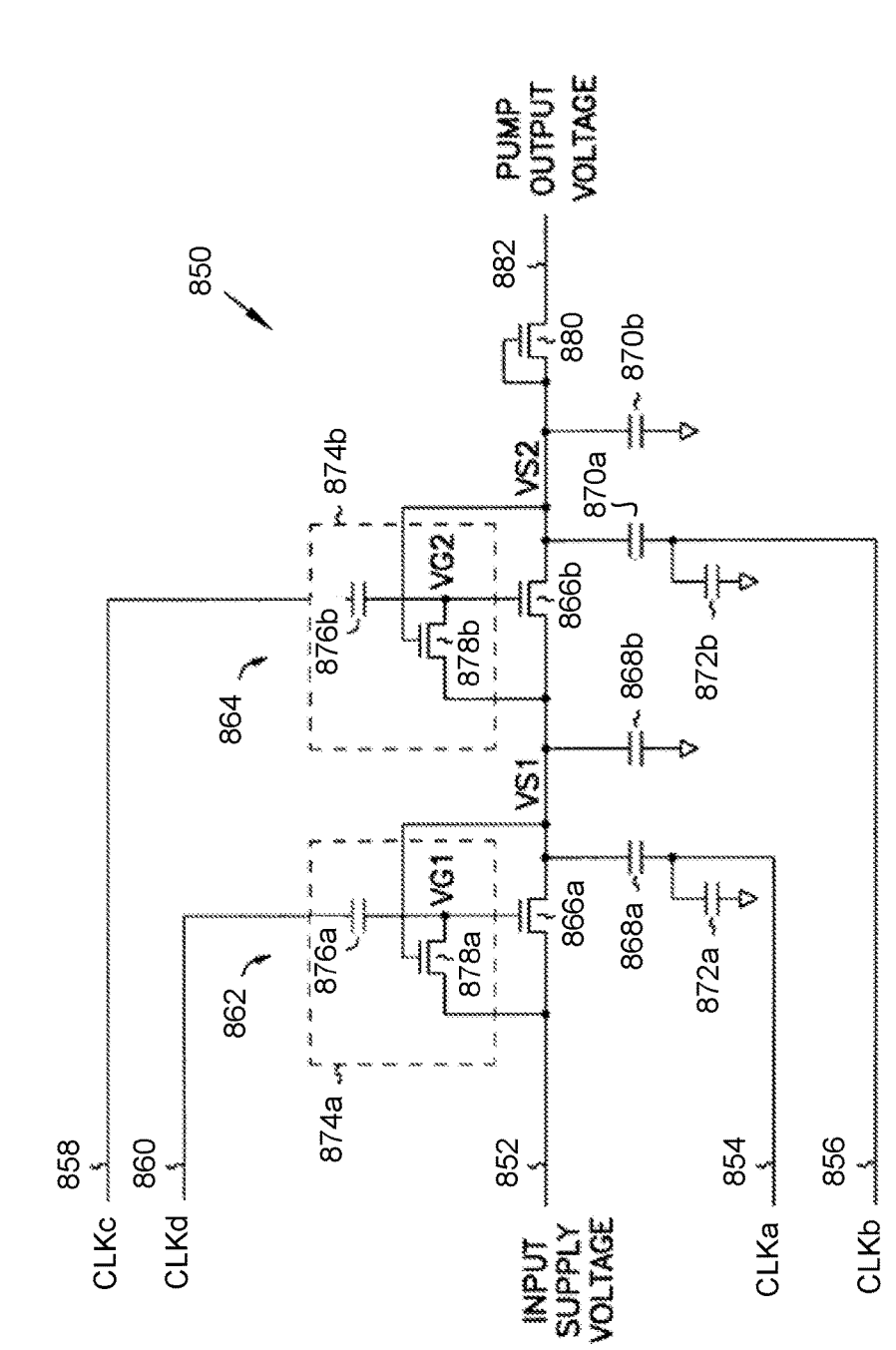
FIG. 8A is an example illustration of a two stage VT-cancellation circuit, according to one embodiment.
Figure 8B:
FIG. 8B is an example illustration of a four phase clock diagram of the two stage VT-cancellation circuit.
Figure 8B:
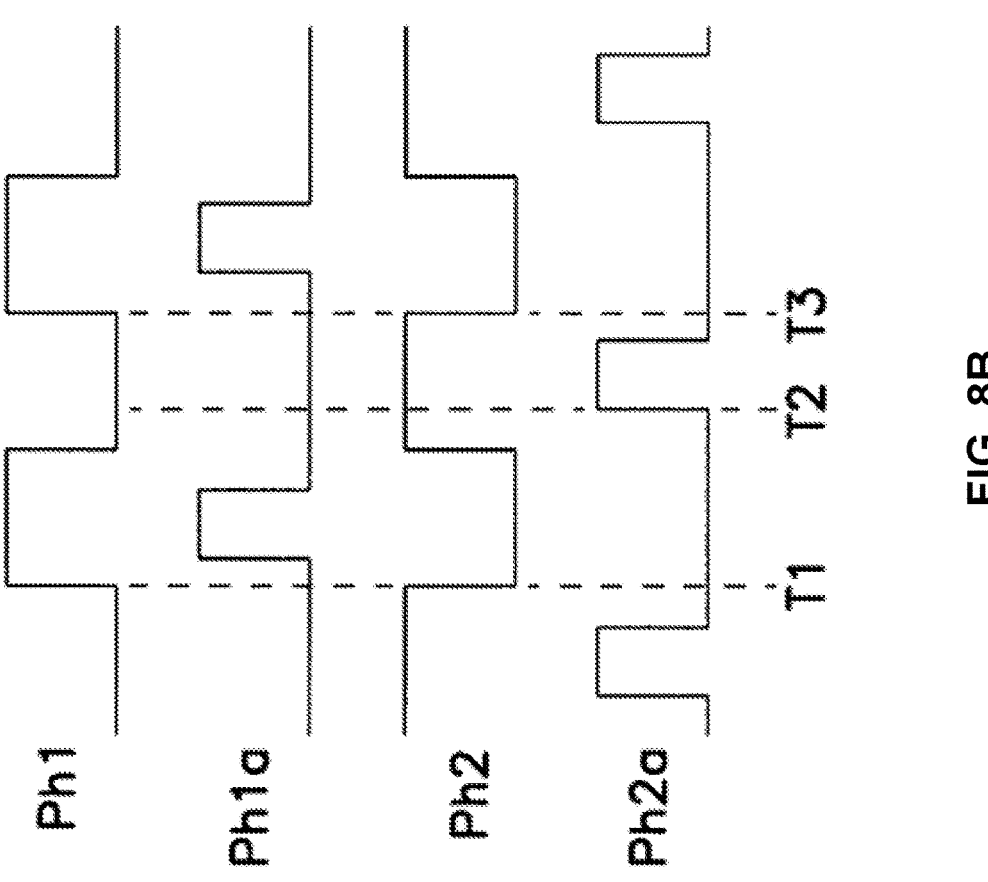

FIG. 8A is an example illustration of a two stage VT-cancellation circuit. As illustrated in FIG. 8A, pump circuit 850 receives an input supply voltage on bus 852. Pump circuit 850 receives four clock signals (CLKa on CLK bus 854, CLKb on CLK bus 856, CLKc on CLK bus 858, and CLKd on CLK bus 860) to control the operation of pump circuit 850. Each clock signal includes a respective CLK signal phase. The four phases of CLK signals CLKa-CLKd are illustrated in a four phase clock timing diagram in FIG. 8B. As illustrated in FIG. 8B, clock signals CLKa and Clkd are typically square waves having opposite phase, while clock signals CLKc and CLKd are square waves that have smaller duty cycles than clock signals of CLKa and CLKb, such that clock CLKc and CLKd have a shorter time at active high values than the time clock signals CLKa and CLKb are at active high values.

A first pump stage 862 comprises a stage transistor 866a and a second pump stage 864 comprises a stage transistor 866b where transistors 866a-866b are configured to act as diodes. Pump stage 862 includes a pump capacitor 868a coupled between clock signal CLKa and an output node VS1 of first pump stage 862. Similarly, pump stage 864 includes a pump capacitor 870a coupled between clock signal CLKb and an output node VS2 of pump stage 864. A capacitance indicated at 868b and 870b represents the stray capacitance (Cs) on the charged node side of pump stages 862 and 864 respectively. In addition, a capacitance labeled 872a and 872b represents the stray capacitance (Cc) of pump capacitors 868a and 870b respectively on the clock side of the pump circuit which arises when pump capacitors 868a-870b are implemented in the form of properly configured transistors or other such fabricated capacitors.

Pump stages 862 and 864 also include VT canceler circuits 874a and 874b respectively. VT canceler circuit 874a includes a canceler capacitor 876a coupled between the CLKd clock signal on line 860 and a VG1 node at the gate of stage switching N-channel transistor 878a having its source coupled to the input supply voltage on bus 852, its drain coupled to node VG1, and its gate coupled to the stage output node VS1, such that when switching transistor 878a is switched on stage transistor 866a. VT canceler circuit 874a also includes a and its gate coupled to the stage output node VS1, such that when switching transistor 878a is switched on stage transistor 866a becomes configured to act as a diode connected between the input supply voltage on bus 852 and the stage output voltage on node VS1. Similarly, VT canceler 874b includes a canceler capacitor 876b coupled between clock signal CLKc on bus 858 and a node VG2 at the gate of stage transistor 866b. VT canceler 874b also includes a switching N-channel transistor 878b having its source coupled to the input of pump stage 864 at node VS1, its drain coupled to node VG2, and its gate coupled to the stage output node VS2.

The VT cancellation operation of pump circuit 850 is better understood by referring to the clock timing diagram of FIG. 8B along with the schematic diagram FIG. 8A. At time T1, clock signal Clka (Ph1) on CLK bus 854 goes active high to cause pump capacitor 868a to be charged. As a result, node VS1 is pumped by an amount of voltage which is based on the ratio of the capacitances of capacitors 868a and 870a.

The increased voltage on VS1 is fed to the gate of switching transistor 878*a* which turns on transistor 878*a*, to thereby effectively connect the input supply voltage on bus 852 to node VG1. Prior to time T2, clock signal CLKa goes inactive low, and at time T2, clock signal CLKd goes active high to cause canceler capacitor 876*a* to charge which pumps the voltage at node VG1. Consequently, the voltage at node VG1 is pumped above the input supply voltage level on bus 852.

The VG1 node voltage at the gate of stage transistor 866 *a* being above the level of the input supply voltage at the drain of stage transistor 866 *a* turns on stage transistor 866 *a* to permit charging of node VS1 to the input supply voltage level on line 852. Therefore, VT canceler circuit 874 *a* compensates for the VT drop across transistor 866 *a*. Without VT canceler circuit 874 *a*, the threshold voltage drop would cause the voltage at node VS1 to be equal to the input supply voltage minus VT (where VT is the threshold voltage drop of stage transistor 866 *a*). With VT canceler circuit 874 *a*, the voltage available at node VS1 is increased substantially to the input supply voltage, which can then be used as a base line voltage for the next pump stage 864.

At time T3, the voltage level of node VS1 is at the input supply voltage level on bus 852. On the rising edge of clock signal CLKa, starting at time T3, node VS1 is pumped up from the input supply voltage level. Clock signals CLKb and CLKc are then employed to control pump circuit 850 to increase the voltage at node VS2 with second pump stage 864. Second pump stage 864 operates similar to first pump stage 862 as described above, except that, instead of pre-charging VS2 to a level corresponding to the input voltage supply, node VG2 is pre-charged to a level equal to that of the voltage at node VS1. Clock signal CLKb is employed to charge capacitor 870*a* to turn on switching transistor 878 *b* to thereby connect node VS1 to VG2. Clock signal CLKc is then employed to charge capacitor 876 *b* to thereby pump node VG2. Pumping node VG2 turns on stage transistor 866 *b* which charges node VS2 to a level corresponding to node VS1. Without VT canceler circuit 876 *b*, node VS2 would be charged only to the level of VS1 minus VT (where VT is the threshold voltage drop of stage transistor 866 *b*).

An output transistor 880 is configured as a diode by coupling its gate to its drain, and provides a pump output voltage on an output line 882. Output transistor 880 is coupled between stage output node VS2 and the pump output voltage on output line 882. Output transistor 880 shields the final pumped voltage at node VS2 from the load or output capacitance connected to output line 882.

Figure 9A:
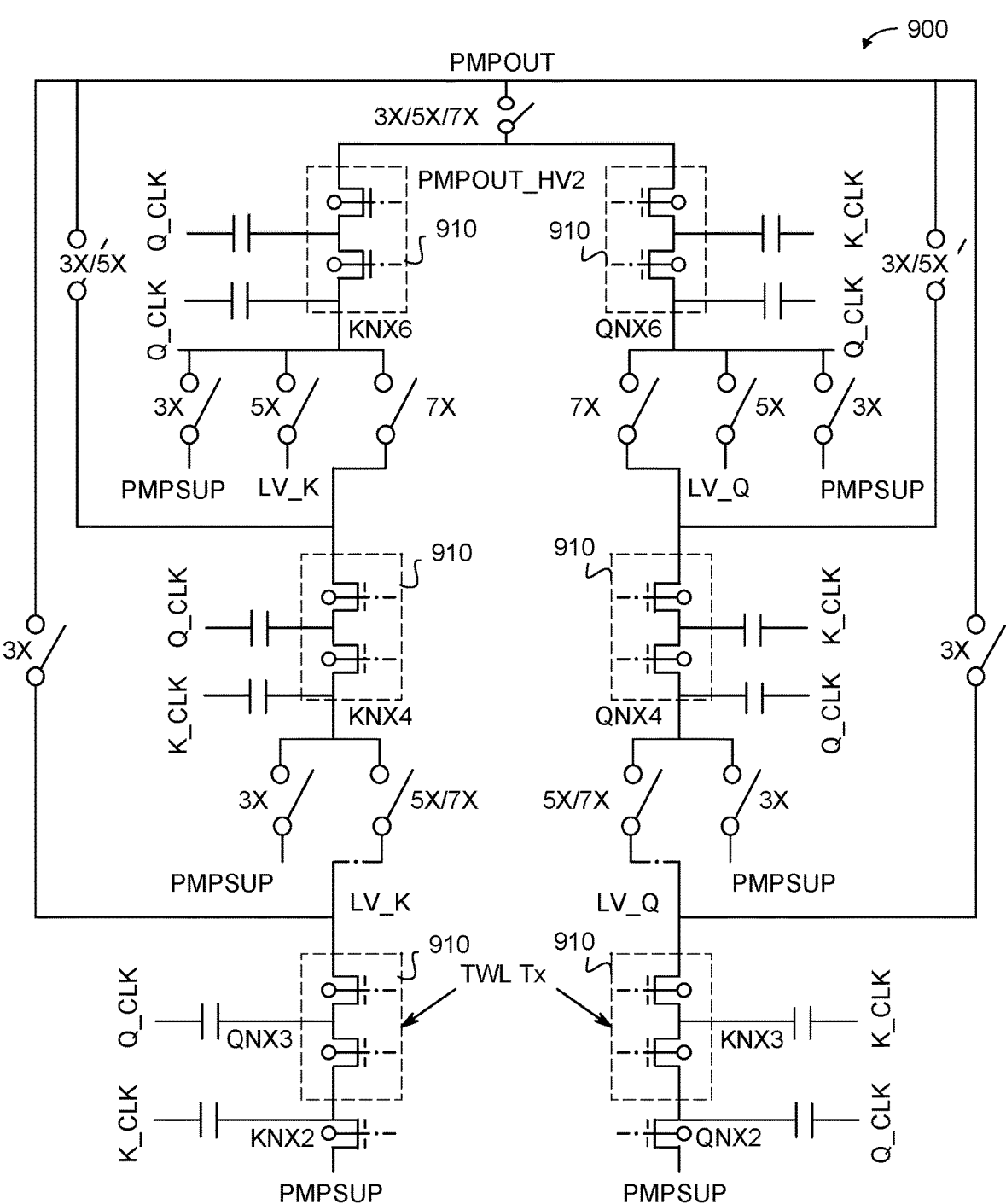
FIG. 9A is an example of a Dickson type charge pump circuit.

FIG. 9A is an example of a Dickson type charge pump circuit 900 comprising LV TWL NMOS devices. The plurality of LV TWL NMOS devices are discussed in further detail in the discussion of the CTS 910 in FIG. 9B. Referring to FIG. 9A, the Dickson type charge pump circuit 900 includes a voltage threshold (VT-cancellation) circuit. A conventional Dickson type charge pump includes several stages (e.g., a first stage, a second stage, a third stage etc.). Each stage increases the input voltage applied to each stage by approximately the amplitude of the kick voltage. Each stage includes a charging half cycle and a transfer half cycle. The rate at which the stages are switched between the charging half cycle and the transfer half cycle is set by the clock frequency supplied to the pump.

The Dickson type charge pump circuit 900 can charge the output node Vout to a multiple of the input supply voltage Vin. Here, the Dickson type charge pump circuit 900 is configured to employ a 1× kick voltage at each stage to achieve the desired voltage. For example, a 7× multiplier Dickson type charge pump circuit 900 can charge the output node Vout to 7*Vin. While in this example the multiplier is 7× (charging Vout to 7*Vin), other multipliers may be implemented without departing from the concepts described herein. For example, in one configuration the multiplier can be 5× (charging Vout to 5*Vin) or for example, in one configuration the multiplier can be 3× (charging Vout to 3*Vin).

A 7× configuration would require 6 stage capacitors to achieve a 7× at PMPOUT. Each capacitor may be charged to a first voltage level during a first phase (i.e., a "charge phase") and then charged to a higher voltage level during a subsequent phase (i.e., a "kick phase"). During the charge phase, a given capacitor is connected across a voltage supply (e.g., Vin), charging it to that same voltage. For a 7× configuration, the first 3 stages can be LV capacitors and the last 3 stages can be HV capacitors. The LV capacitor to HV capacitor ratio is 1:1.

Figure 9B:
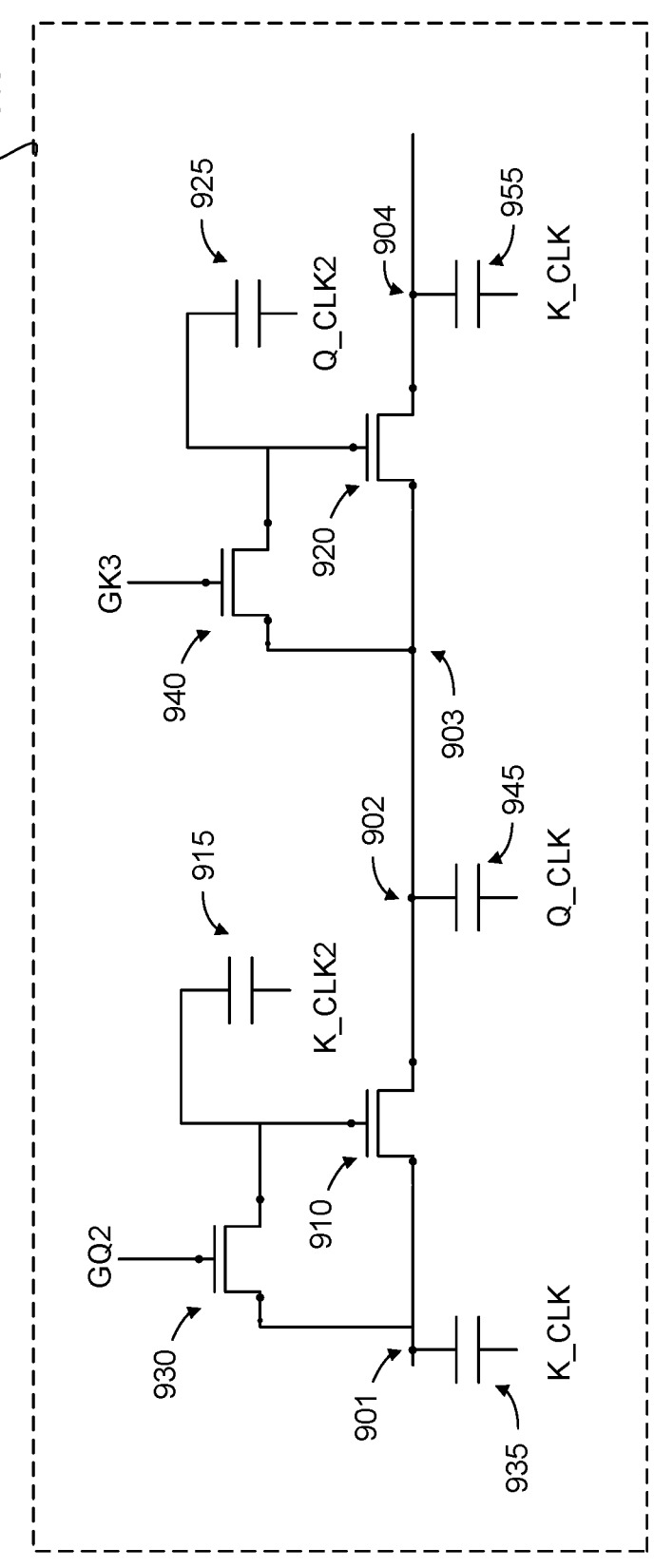
FIG. 9B is an example schematic illustration of a charge transfer switch (CTS) circuit for the Dickson type charge pump circuit of FIG. 9A.

FIG. 9B is an example schematic illustration of a charge transfer switch (CTS) design for the charge pump of 9A. The CTS 900 includes two stages of a plurality of low voltage (LV) N-type field effect transistor devices 910, 920, 930, 940 connected in series between a source of voltage Vcc and an output terminal Vout. The first stage of the CTS 900 includes a transistor device 930 used to control the voltage at the gate terminal of transistor device 910. Transistor device 930 and transistor 940 are hereafter referred to as "control device 930" and "control device 940." The second stage of the CTS 900 includes a transistor device 940 used to control the voltage at the gate terminal of transistor device 920. The CTS 900 further includes a plurality of CLKs K_CLK, Q_CLK, K_CLKX2G and Q_CLKX2G configured to furnish a plurality of input CLK signals to the CTS 900. Each input CLK signal includes a phase. For example, the K_CLK is configured to provide a first CLK signal having a first phase, Q_CLK is configured to provide a second CLK signal having a second phase, K_CLKX2G is configured to provide a third CLK signal having a third phase and Q_CLKX2G is configured to provide a fourth CLK signal having a fourth phase. In one configuration, the CLK signals K_CLK and K_CLKX2G are in the same phase and CLK signals Q_CLK, and Q_CLKX2G are in the same phase, but CLK signals K_CLKX2G and Q_CLKX2G have greater amplitudes. CLK signals from CLKs K_CLKX2G and Q_CLKKX2G are furnished to the CTS via capacitors 915 and 925. CLK signals from CLKs K_CLK and Q_CLK are furnished to the CTS via capacitors 935, 945 and 955.

When the CLK signal from Q_CLK is high, control device 930 is on. When the K_CLK signal goes low, the voltage pulse applied through the capacitor 935 charges capacitor 915 at the gate terminal of device 910 through control device 930 to the voltage level of the drain terminal of the device 910. When the Q_CLK CLK signal goes low, the device 930 turns off, isolating the gate of the device 910 and leaving the capacitor 915 charged. This also lowers the voltage at the source of the device 910 so that the device 910 begins to conduct. When the K_CLK2 CLK signal goes high, the voltage at the gate is appreciably higher than at the drain because of the precharging of the capacitor 915. This turns the device 910 on in the region in which it experiences no threshold voltage (VT) drop. The elimination of the VT drop means that the circuit can provide increased current from the capacitor to the next stage. The high voltage at the capacitor 935 begins to rapidly charge the capacitor 945 and capacitor 925 through device 940.

When K_CLK2 CLK signal is low, the gate terminal of device 910 discharges. When the Q_CLK CLK signal is high, the device 930 turns on, discharging the gate of device 910 and bringing it toward the voltage of the drain so that the device 910 rapidly turns off. When the K_CLK CLK signal is low, the device 910 stays off and the device 930 stays on so that the charge at the drain and gate are equalized. The high CLK signal from the K_CLK continues the charging of the capacitor 915 until the drop of the Q_CLK CLK signal turns off the device 930 leaving the gate of the device 910 charged. The lowering of the Q_CLK CLK signal begins turning on the device 910 which comes on completely without a VT drop when the K_CLKX2G CLK signal goes high and the gate of device 910 goes above the drain. This allows the rapid charging of capacitors 945 and 925. The same sequence continues through N number stages until the charge on capacitor 955 is sufficient to provide a pumped voltage level at the output of the CTS circuit 900.

Once capacitors 915 and 925 are charged, the charging path is cut off so that the charge cannot dissipate before the devices 910 and 920 are turned on. The two stage CTS 900 furnishes approximately N (where N is the number of stages) plus one times the voltage of the source Vcc at the output terminal.

A 1× kick voltage is applied to and stored in each capacitor 935, 945 and 955 via a respective CLK signal. For example, a 1× kick voltage is applied to capacitor 935 via K_CLK signal. A 1× kick voltage is applied to capacitor 945 via Q_CLK signal and a 1× kick voltage is applied to capacitor 955 via K_CLK signal.

For example, if a 2× kick voltage is received as an input to the circuit at node 901 and a 1× kick voltage is applied to/stored at capacitor 945 then the voltage difference across each terminal in device 910 would only be 2× (as node 901 moves from 2× to 1×. due to 1× kick and 902 moves from 2× to 3× due to the 1× kick) and a 3× voltage at node 902). LV TWL NMOS devices can operate up to a 2× voltage differential. If Since the voltage difference across each terminal of device 910 is only 2× the device 910 will not experience an EDR violation. In addition, if the 3× voltage at node 902 is passed to node 903 and a 1× kick voltage is applied to/stored at capacitor 955, then the voltage difference across each terminal in device 920 would only be 2×. For example, during the first phase a 3× voltage is observed at node 903 and a 4× voltage is observed at node 904. During a second phase a 2× voltage is observed at node 903 and a 4× voltage is observed at node 904. Thus, the max difference is 2×. A max difference of 2× is allowed and does not result in an EDR violation.

An EDR violation will results if a 2× kick voltage is applied to the CTS 910. For example, if a 3× kick voltage is received at the input of the CTS 910 and passed through device 910 to node 903, then device 920 will experience an EDR violation since each terminal (e.g., source and drain) of device 920 will experience a voltage difference of greater than 2×.

If a 2× kick voltage is applied to node 904, then the voltage difference across the terminals of device 920 will be 3× and 6×, thus resulting in a voltage difference higher than the 2× required for a LV TWL NMOS device to function. If the LV TWL NMOS device experiences a voltage difference of greater than 2×, the circuit will experience an EDR violation. Although a CTS circuit comprising HV transistors can operate with voltage differences of greater than 2× between the terminals of the HV transistors, the increased circuit footprint of the HV transistors greatly decreases performance when compared to LV TWL NMOS devices. Thus, there is a need for the double switch CTS 1010 of FIG. 10B, which combines the smaller circuit footprint of the LV TWL NMOS devices and the performance capabilities of a HV transistor based CTS. As explained in further detail in FIG. 10B the double switch architecture of the double switch CTS 1010 allows the circuit to operate LV TWL NMOS devices for 2× kick voltages in 3×, 5× and 7× stages of the charge pump.

Figure 9C:
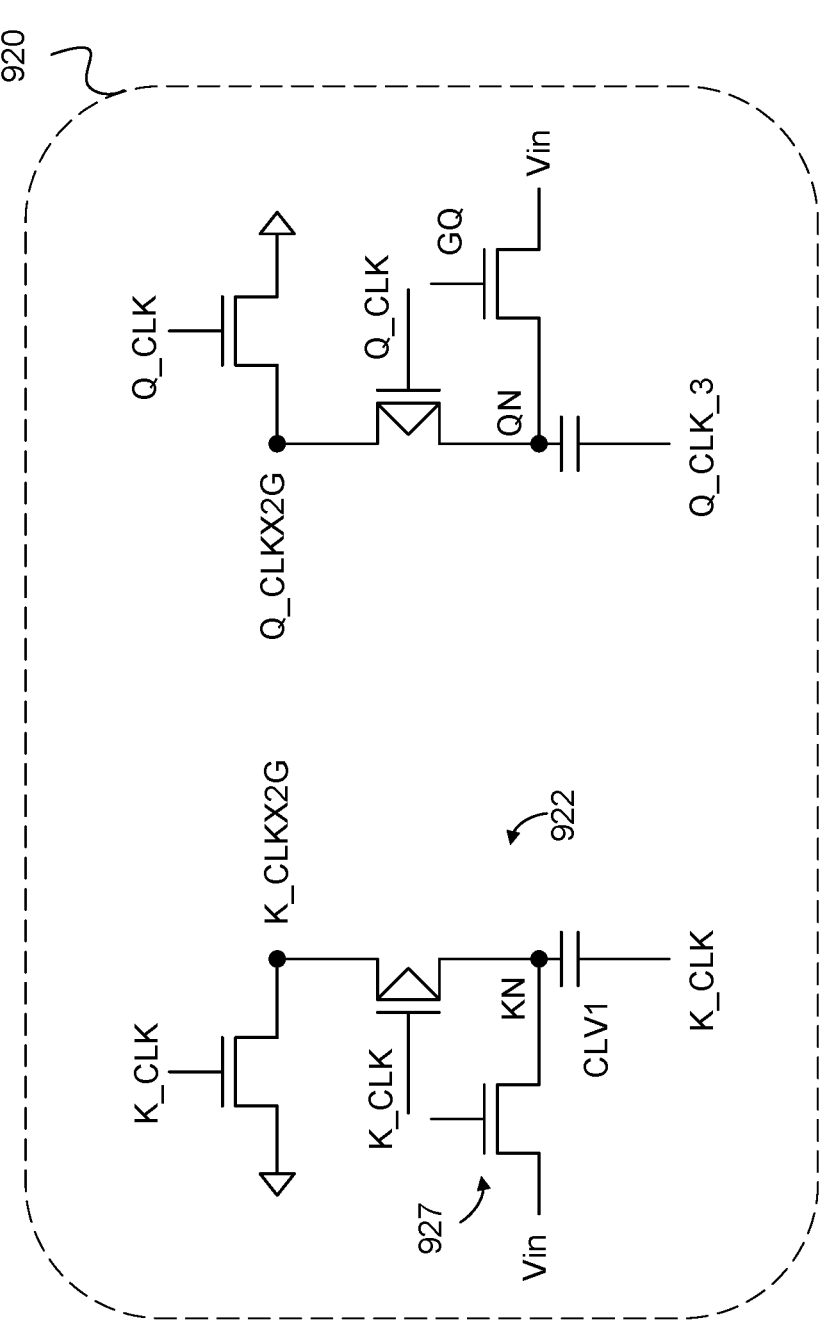
FIG. 9C is an example schematic illustration of an additional circuit for generating the gate voltages of the CTS circuit of FIG. 9B.

FIG. 9C is an example schematic of an additional circuit 920 for generating gate voltages of the CTS 910. The additional circuit 920 outputs a K_CLK CLK signal and a Q_CLK CLK signal. The CLK signals K_CLK, and Q_CLK are used as CLK inputs to the CTS circuit 920. The additional circuit 920 includes at least a first stage 922. The first stage 922 can be referred to as a low voltage stage. While FIG. 9C depicts at least a first stage, more stages may be implemented without departing from the concepts described herein. The first stage 922 includes a low voltage capacitor $C_{LV1}$.

In general, a low voltage capacitor may be charged to a first voltage level during a first phase (charge phase), and then charged to a higher voltage level during a subsequent phase (kick phase). During the charge phase, the low voltage capacitor connected across a voltage supply (e.g., Vin), charging it to the same voltage. During the kick phase, the circuitry around the capacitor is reconfigured so that the capacitor is in series with the supply and an output node. This doubles the voltage at the output node (e.g., to 2*Vin, the sum of the original voltage supply and the capacitor voltage).

As seen in FIG. 9C, the low voltage capacitor $C_{LV1}$ is connected across a voltage supply Vin charging it to a first voltage level during the charge phase. During the kick phase, the circuitry around capacitor $C_{LV1}$ is reconfigured so that capacitor $C_{LV1}$ is in series with the supply and output node. For example, when charging $C_{LV1}$, $K_{CLk}$ may be grounded and an NMOS transistor 927 may connect node KN to voltage supply $V_{in}$, thereby charging $C_{LV1}$ from 0 to Vin. When $K_{CLk}$ goes high in the next clock phase, voltage supply Vin is disconnected by transistor KQ and capacitor $C_{LV1}$ gets kicked (the capacitor is charged to a higher level through its bottom plate) by the $K_{CLK}$ signal. If the $K_{CLK}$ signal is equal to Vin, then node KN increases from Vin to 2*Vin. In general, once a capacitor at a given stage is initially charged, and then its bottom plate is kicked, the voltage at the node at the top plate of the capacitor may increase to a higher level than is available at the storage device.

The capacitor at a give stage may be kicked by voltage supplied by the preceding stage. The charge may keep building to the last stage in order to realized the final voltage Vout. However, by multiplying the voltage stage by stage in such a manner, an increasing amount of supply current may be lost, which may lead to significant drops in efficiency.

Before $K_{CLK}$ CLK signal rises (i.e., during the charge phase when $K_{CLK}$ is still low), the charge at node KN is equivalent to Vin. The charge (Vin) is passed to a node at the next stage (not shown) before $K_{CLK}$ CLK signal has goes high. As a result, the capacitor (not shown) of the next stage (not shown) receives a kick on Vin, which causes the voltage at the next node (not shown) to increase to 2*Vin. When $K_{CLK}$ CLK signal goes high (equivalent to Vin), this causes the voltage at nodes KN and the node at the next stage (not shown) to increase from Vin to 2*Vin, and the voltage at the next node (not shown) to increase from 2*Vin to 3*Vin.

Figure 10A:
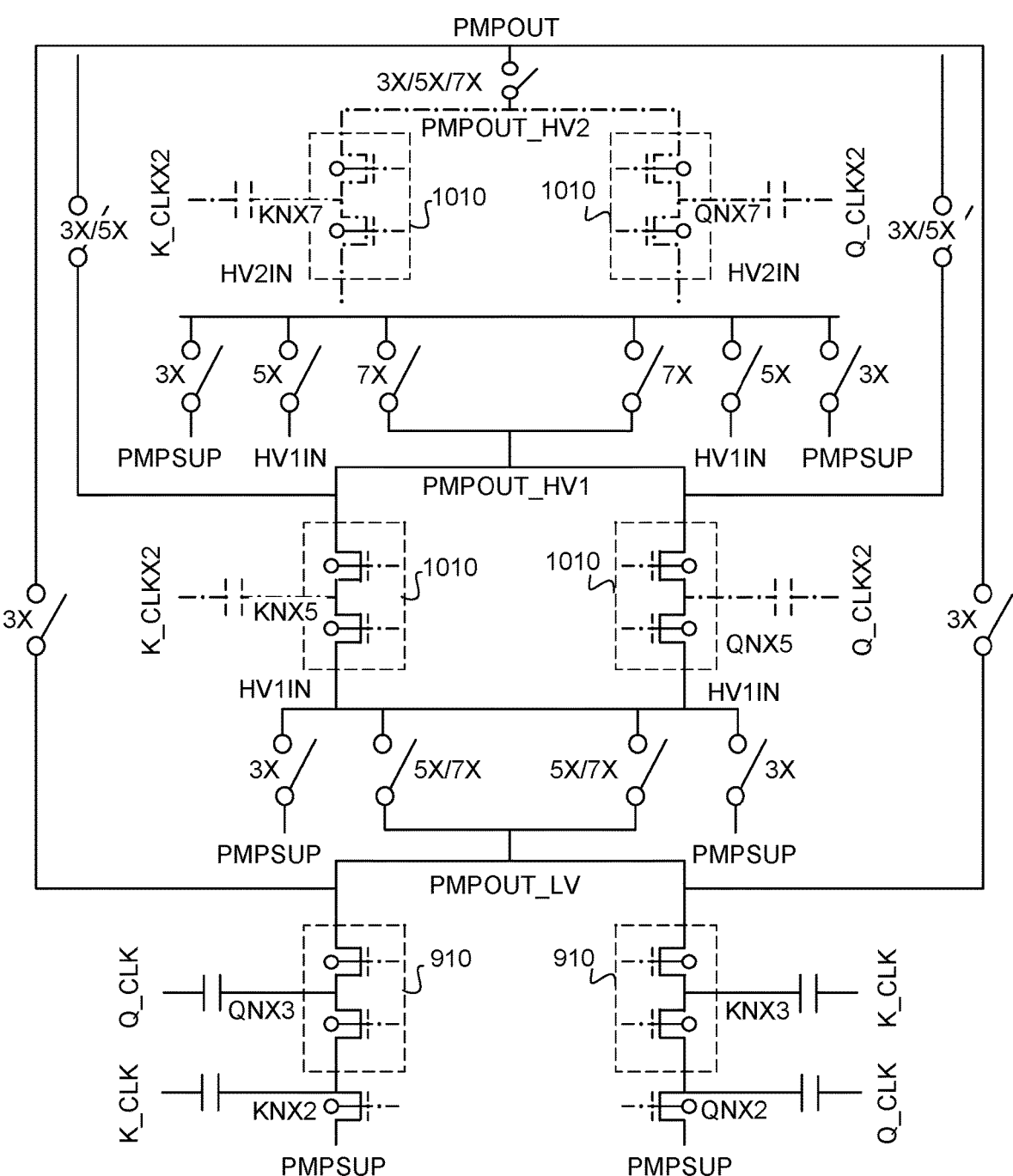
FIG. 10A is a schematic illustration of an area efficient charge pump circuit, according to one embodiment.

FIG. 10A is a schematic illustration of an area efficient charge pump 1000. The Dickson type charge pump 900 of FIG. 9A suffers from a few flaws. For a 7× configuration, the Dickson type charge pump 900 requires 3 LV capacitors and 3 HV capacitors. The 3 LV capacitors and 3 HV capacitors create a 1:1 ratio of LV to HV capacitors. LV capacitors have a higher capacitor density than HV capacitors. A higher capacitor density results in a smaller circuit footprint. Thus, an LV capacitor has a smaller circuit footprint than a HV capacitor. The smaller circuit footprint increases the performance of the circuit. Decreasing the amount of HV capacitors decreases circuit footprint. For example, a 3:1 ratio of LV capacitors to HV capacitors decreases the circuit footprint since the circuit includes fewer HV capacitors. However, to power a charge pump circuit with fewer HV capacitors, a larger kick voltage is required.

By altering the ratio of LV capacitors to HV capacitors from 1:1 (LV:HV) to 3:1 (LV:HV), the proposed charge pump 1010 requires a kick voltage increase from 1× to 2×. However, passing a 2× kick voltage through CTS switch 910 would violate the electrical design rule (EDR) for LV TWL NMOS transistors. For LV TWL NMOS transistors to function, the voltage difference across any two terminals (e.g., source and drain) of the LV TWL NMOS transistor must be less than or equal to 2×. If the voltage difference across the terminals of a LV TWL NMOS is greater than 2×, the circuit will violate the EDR. Although HV transistors can pass a greater than 2× kick voltage, using a HV CTS switch would degrade performance due to the increased circuit footprint that results from the use of HV transistors. Unlike HV transistors, LV transistors are more capable of transmitting 2× kick voltages. However, the increased area decreases the usefulness of the HV transistors. The proposed circuit architecture of the charge pump 1000 uses a CTS design 1010 that doesn't use HV N-type field effect transistors. Instead, the CTS design 1010 uses LV TWL NMOS devices in the CTS. By not using HV transistors, the double switch CTS design decreases the circuit footprint. Using HV transistors with 2× voltage kick requires a large circuit area than LV N-type devices. HV transistors can transmit 2× kick voltages but are not good for performance as the larger the circuit footprint the poorer the performance. Transmitting a 2× kick voltage on LV transistors results in EDR violation. Thus, LV transistors with the CTS design of FIG. 9B cannot transmit 2× kick voltage. The double switch arrangement LV N-type based CTS design of FIG. 10B can transmit 2× kick without an EDR violation. In addition, the use of a 3:1 LV capacitor to HV capacitor ratio for the charge pump and of LV TWL NMOS devices in the CTS design 1010 leads to a 17% area reduction in the charge pump circuit footprint.

To reduce the requirement for a 1:1 ratio of LV capacitors to HV capacitors, the charge pump 1000 deploys a 2× kick voltage for HV stages. Deploying a 2× voltage at HV stages increases the amount of LV capacitors, thus creating a 3:1 ratio of LV capacitors to HV capacitors. The 3:1 ratio of LV capacitors to HV capacitors decreases the circuit footprint of the charge pump 1000. However, because of the 2× kick voltage, the charge pump 1000 requires a unique CTS switch. Using a conventional CTS switch comprising HV transistors for a 2× kick voltage degrades the performance of the CTS. If LV transistors are used for conventional CTS design an EDR violation results. A CTS switch comprising LV transistors allows a 2× kick without an EDR violation. The proposed area efficient charge pump with double switch CTS can be applied to any HV charge pump with configuration greater than 3× to achieve similar area reduction.

Figure 10B:
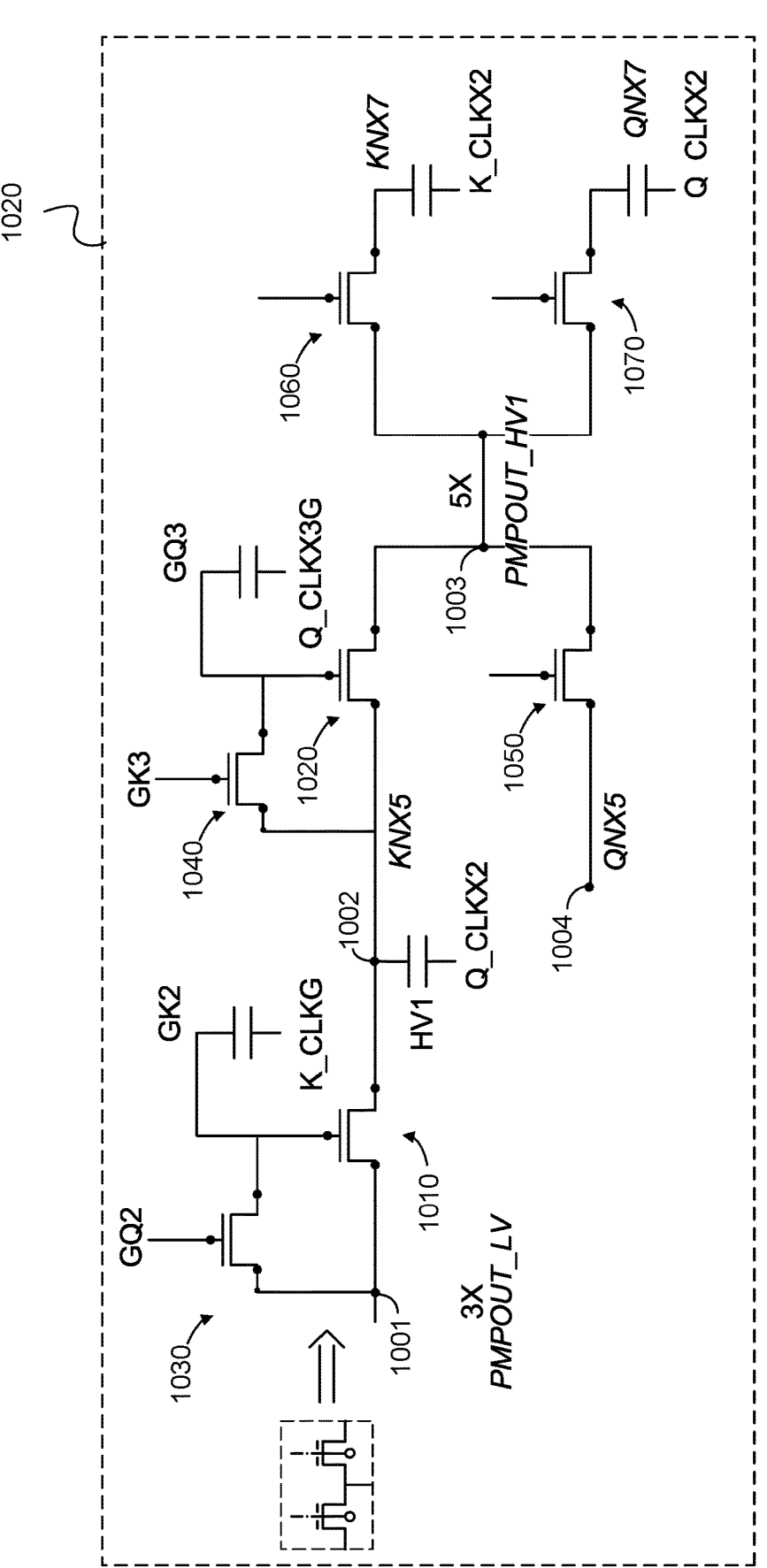
FIG. 10B is an example schematic illustration of a double switch (CTS) circuit design for the charge pump circuit of FIG. 10A.

FIG. 10B is an example schematic illustration of a double switch charge transfer switch (CTS) design for the charge pump of 10A. The double switch CTS 1010 includes a plurality of LV TWL NMOS devices. In one configuration, the charge transfer switch 1010 includes only a plurality of LV TWL NMOS devices (i.e., the charge transfer switch

1010 does not include a HV transistor). To avoid an EDR violation when used in charge pump 1000, the double switch CTS 1010 uses a different design than the CTS 910 for HV cap stages in charge pumps. Instead of using a plurality of HV transistors, CTS 1010 uses a plurality of LV NMOS devices (e.g., devices 1010, 1020, 1030, 1040). In one configuration, the first switch is device 1020 and the second switch is device 1060.

Node 1001 receives the input voltage of 3×. In order to pass the input voltage of 3× through transistor 1010, a 4× voltage must be applied at the gate. When a 4× voltage is applied to the gate of transistor 1010, the input voltage is passed through transistor 1010 to node 1002. The 3× voltage is then kicked to 5× at node 1002, via a 2× voltage provided by capacitor HV1. Thus at node 1002, a 5× voltage is observed. To pass the 5× voltage through transistor 1020, a 6× voltage must be applied at the gate. When the 6× voltage is applied to the gate of transistor 1020, the input voltage is passed through transistor 1020 to node 1003.

Instead of directly transferring the kicked voltage to the next stage, the double switch CTS circuit includes a supply line that is connected across PMPOUT_HV1. The supply line connects the output of the first circuit 1070 to a mirrored circuit 1075. The mirrored circuit includes a LV TWL NMOS device. By shorting the circuit across the mirrored portion of the circuit, the CTS 1010 avoids an EDR violation. For example, during a first phase a 3× kick voltage is observed at node 1002 and at a gate of device 1020. During the first phase a 5× kick voltage is observed at the source of device 1020 and 1050 and a 6× kick voltage is observed at device 1050. Thus, the voltage difference across any two terminals of device 1020 and 1050 is less than 2×. During a second phase a 5× kick voltage is observed at device 1002 and a 6× kick voltage is observed at the gate of device 1020. During the second phase a 3× kick voltage is observed at node 1004 and at gate 1050, while a 5× kick voltage is observed at device 1020 and 1050. Thus, the voltage difference across any two terminals of device 1020 and 1050 is less than 2×. For example, the gate voltage of device 1020 is 2× and the gate voltage of device 1050 is 1×. By separating the gate voltage from the Q_CLKX3G source, both devices 1050 and 1020 can continue to operate to pass the kick voltages through each device 1050, 1020 respectively without an EDR violation.

The double switch CTS 1010 used in charge pump 1000 requires merging of two phases to generate the voltage supply line at the PMPOUT_LV required by the circuit architecture of charge pump 1000. The merged supply is fed to the double CTS 1010. In the double switch arrangement of the double switch CTS, the first switch is used to charge the HV1 capacitor to 3× voltage in a first clock signal phase of first CLK signal. In the second clock signal phase of the second CLK signal, the HV1 capacitor is kicked by a 2× voltage. By kicking the HV1 capacitor to 3× on the first clock phase and 2× on the second clock phase, a 5× voltage is observed at node KNX5 without device 1020 experiencing more than 2×. Maintaining a max of 2× voltage difference across the terminals of device 1020 (e.g., the source and drain) prevents an EDR violation. Thus, the HV1 capacitor can be kicked by a 3× and 2× kick voltage without requiring device 1020 to experience a voltage difference of more than 2× across any of the device terminals, thereby maintaining EDR specifications. The second switch (e.g., device 1060) in the double switch arrangement is used to pass 5× voltage generated in the second CLK signals phase of the second CLK to the supply line PMPOUT_HV1. During both the first CLK signal phase and the second CLK signal phase the second switch (e.g., device 1060) never experiences a voltage difference of more than 2× across any two terminals.

Figure 10C:
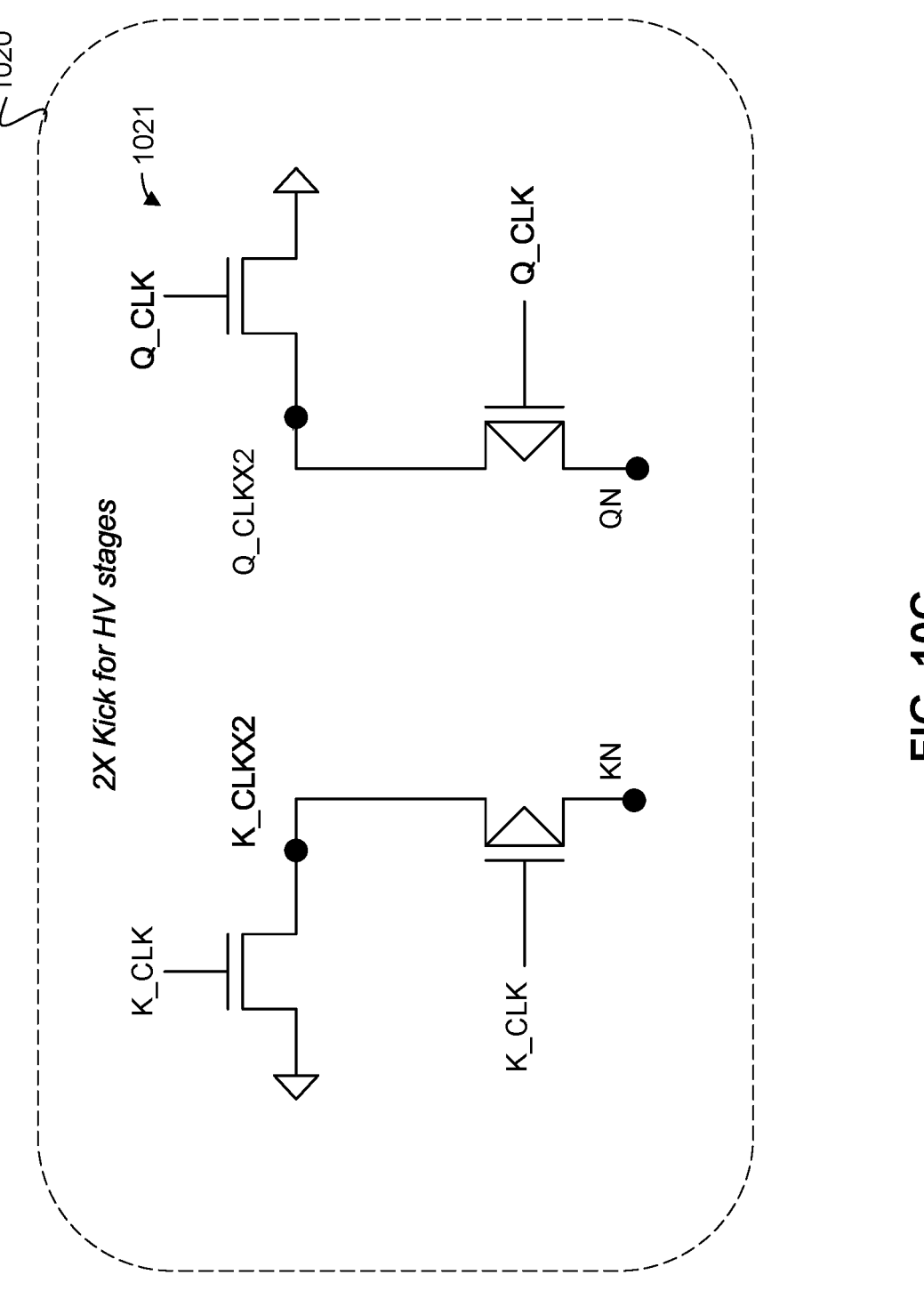
FIG. 10C is an example schematic of an additional circuit for generating the gate voltages of the double switch CTS circuit of FIG. 10B.

FIG. 10C is an example schematic of an additional circuit 1020 for generating gate voltages of the CTS 1010. The additional circuit 1020 outputs a K_CLKX2 CLK signal and a Q_CLKX2 CLK signal. The CLK signal is used as an input to the CTS circuit. The additional circuit 1020 includes at least a first stage 1021.

Before $K_{CLK}$ CLK signal rises (i.e., during the charge phase when $K_{CLK}$ is still low), the charge at node KN is equivalent to Vin. The charge (Vin) is passed to a node at the next stage (not shown) before $K_{CLK}$ CLK signal has goes high. As a result, the capacitor (not shown) of the next stage (not shown) receives a kick on Vin, which causes the voltage at the next node (not shown) to increase to 2*Vin. When $K_{CLK}$ CLK signal goes high (equivalent to Vin), this causes the voltage at nodes KN and the node at the next stage (not shown) to increase from Vin to 2*Vin, and the voltage at the next node (not shown) to increase from 2*Vin to 3*Vin.

Figure 11:
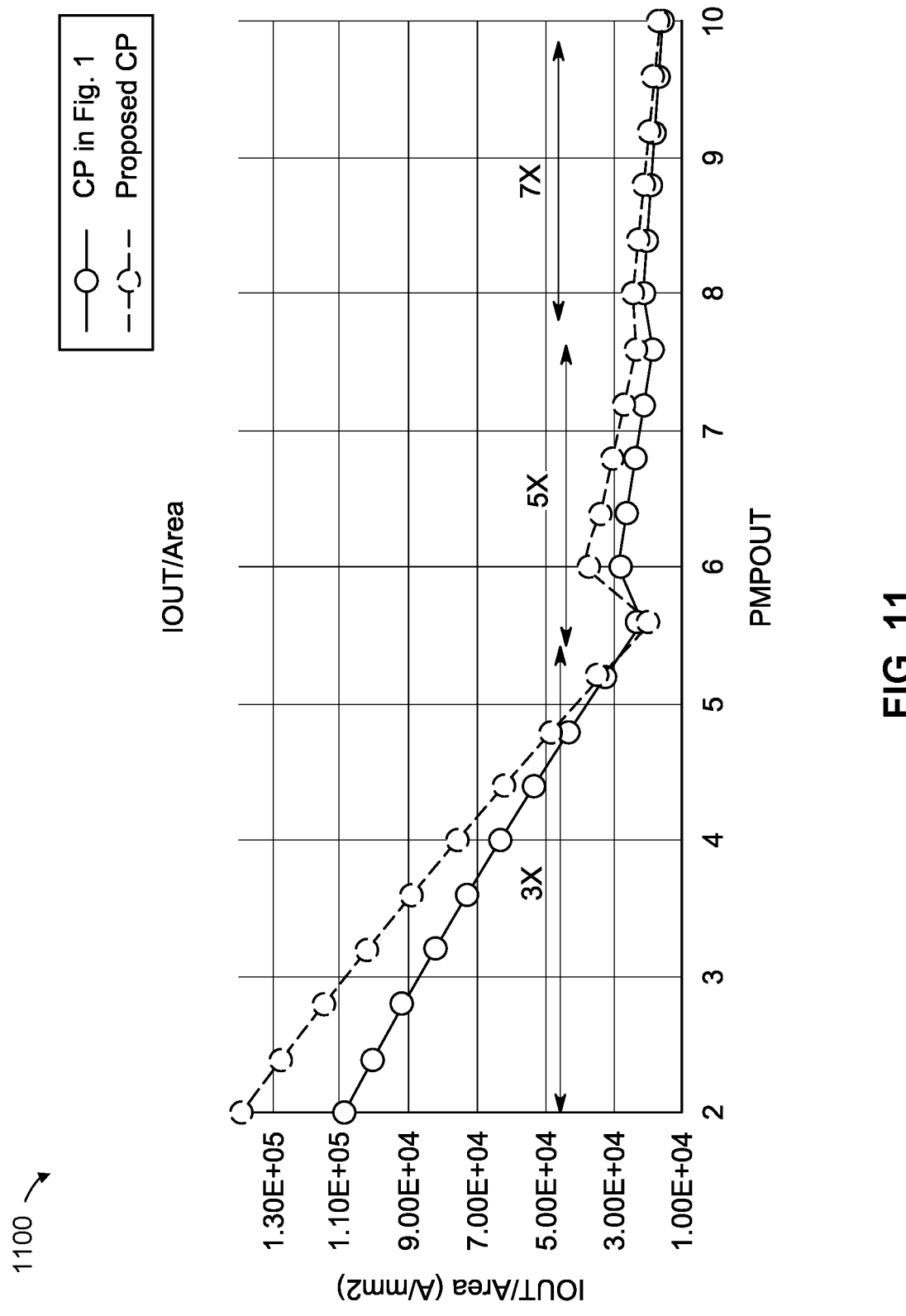
FIG. 11 is an example illustration of a chart comparing the circuit footprint of a conventional Dickson charge pump and the proposed area efficient charge pump, according to one embodiment.

FIG. 11 is an example illustration of a chart comparing the circuit footprint of a conventional Dickson charge pump and the proposed area efficient charge pump, according to one embodiment. As seen in FIG. 11, the area efficient charge pump 1000 with double switch CTS 1010 decreases the circuit footprint by: 17 percent in 3× charge pump configurations, 21 percent in 5× charge pump configurations and 18 percent in 7× charge pump configurations. Thus, the proposed area efficient charge pump 1000 circuit architecture results in at least an circuit area reduction of 17 percent. Decreasing circuit area results in increased charge pump performance and efficiency. Specifically, the reduction of HV capacitors which occupy a large circuit footprint due to their low density results in increased charge pump performance.

The processes and algorithms may be implemented partially or wholly in application-specific circuitry. The various features and processes described above may be used independently of one another, or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments.

As used herein, a circuit might be implemented utilizing any form of hardware, software, or a combination thereof. For example, one or more processors, controllers, ASICs, PLAS, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

It is intended that the foregoing be understood as an illustration of selected forms that the invention can take and not as a definition of the invention. Finally, it should be noted that any aspect of any of the preferred embodiments described herein can be used alone or in combination with one another.

What is claimed is:

1. A method of generating a voltage waveform having an amplitude three times an input voltage amplitude using a plurality of low voltage (LV) triple well (TWL) N-type field effect devices, the method comprising:

receiving a first input voltage at a first input of a double switch charge transfer switch (CTS) circuit, the double switch CTS circuit comprising a first portion having a first output and a second portion comprising a second output;

applying a 2× kick voltage to a first capacitor coupled to the first portion of the double switch CTS circuit, the first capacitor configured to discharge a kick voltage to a source of a first LV TWL N-type field effect device of the plurality of LV TWL N-type field effect devices; and applying a 1× kick voltage to a second capacitor coupled to the second portion of the double switch CTS circuit, the second capacitor configured to discharge a kick voltage to a source of a second LV TWL N-type field effect device of the plurality of LV TWL N-type field effect devices.

2. The method of claim 1, wherein the output of the first portion is coupled to the output of the second portion to provide a single double switch CTS circuit output.

3. The method of claim 1, wherein the double switch CTS circuit includes a plurality of TWL NMOS devices, the plurality of TWL NMOS devices configured to generate the 2× kick voltage.

4. The method of claim 1, wherein the first portion of the double switch CTS circuit includes a first control device and the second portion of the double switch CTS circuit includes a second control device, the first and second control device configured to control a gate voltage applied to the first LV TWL N-type field effect device and the gate voltage applied to the second LV TWL N-type field effect device respectively.

5. The method of claim 4, wherein the double switch CTS circuit includes a plurality of clock signals configured to furnish a plurality of input clock signals to the CTS circuit, the plurality of clock signals including a first clock signal having a first phase and a second a second clock signal having a second phase.

6. The method of claim 5, wherein the plurality of clock signals further include a third clock signal having a third phase and a fourth clock signal having a fourth phase.

7. The method of claim 6, wherein the first clock signal and the second clock signal are in a same phase.

8. The method of claim 7, wherein the third clock signal and the fourth clock signal are in the same phase.

9. The method of claim 7, wherein the first clock signal is furnished to a capacitor coupled to a gate of the first LV TWL N-type field effect device and the second clock signal is furnished to a capacitor coupled to the gate of the second LV TWL N-type field effect device.

10. The method of claim 9, wherein the third clock signal is furnished to a capacitor coupled to the source of the first LV TWL N-type field effect device and the third clock signal is furnished to a capacitor coupled to a drain of the second LV TWL N-type field effect device.

11. The method of claim 10, wherein the fourth clock signal is furnished to a capacitor coupled to a drain of the first LV TWL N-type field effect device and the fourth clock signal is furnished to a source of the second control device.

12. A charge pump system comprising:
a plurality of circuit stages configured to increase a voltage applied at an input of each stage, each stage comprising:
a double switch charge transfer switch comprising a plurality of low voltage N-type devices, the double switch charge transfer switch comprising:
a first set of circuitry configured to generate a voltage waveform having an amplitude three times an input voltage amplitude, the first set of circuitry configured to: (i) provide a 2× kick voltage across each terminal of a first low voltage N-type device, and (ii) provide a 1× kick voltage across each terminal of a second low voltage N-type device.

13. The charge pump system of claim 12, further comprising a second set of circuitry configured to generate a voltage waveform having an amplitude two times the input voltage amplitude.

14. The charge pump system of claim 12, wherein the first set of circuitry includes a first set of low voltage triple well N-type field effect transistors.

15. The charge pump system of claim 12, wherein the second set of circuitry includes a second set of low voltage triple well N-type field effect transistors.

16. The charge pump system of claim 12, further comprising a HV capacitor coupled to the first set of circuitry, the HV capacitor configured to store a kick voltage applied to the circuit.

17. The charge pump system of claim 16, wherein the kick voltage is at least 2×.

18. A charge pump comprising:
a first set of circuitry configured to generate a voltage waveform having an amplitude three times an input voltage amplitude, the first set of circuitry configured to: (i) provide a 2× kick voltage across each terminal of a first low voltage N-type device, and (ii) provide a 1× kick voltage across each terminal of a second low voltage N-type device.

19. The charge pump of claim 18 further comprising a double switch charge transfer switch (CTS) circuit comprising a plurality of N-type devices configured to:
apply the 2× kick voltage to a first capacitor coupled to a first portion of the double switch CTS circuit, the first capacitor configured to discharge a kick voltage to a source of a first LV TWL N-type field effect device of a plurality of LV TWL N-type field effect devices; and
apply the 1× kick voltage to a second capacitor coupled a second portion of the double switch CTS circuit, the second capacitor configured to discharge a kick voltage to a source of a second LV TWL N-type field effect device of the plurality of LV TWL N-type field effect devices.

20. The charge pump of claim 19, wherein the plurality of N-type devices include a plurality of TWL NMOS devices configured to generate the 2× kick voltage.

* * * * *